(12) United States Patent
Sada et al.

(10) Patent No.: US 7,381,935 B2
(45) Date of Patent: Jun. 3, 2008

(54) LASER POWER CONTROL WITH AUTOMATIC POWER COMPENSATION

(75) Inventors: Gilberto I. Sada, Irvine, CA (US); Maurice M. Reintjes, Beaverton, OR (US); Keith R. Jones, Irvine, CA (US); Daniel Draper, Portland, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 564 days.

(21) Appl. No.: 10/993,525

(22) Filed: Nov. 19, 2004

(65) Prior Publication Data

US 2006/0108500 A1 May 25, 2006

(51) Int. Cl.
*G01J 1/32* (2006.01)

(52) U.S. Cl. ................ 250/205; 250/214 R

(58) Field of Classification Search .......... 250/205, 250/214 R, 201.1, 214 C; 372/29.011, 29.014, 372/29.021, 31, 32, 34; 398/136, 137
See application file for complete search history.

(56) References Cited

U.S. PATENT DOCUMENTS

| | | | |
|---|---|---|---|
| 5,019,769 A | 5/1991 | Levinson | |
| 5,383,208 A | 1/1995 | Queniat et al. | |
| 5,396,059 A | 3/1995 | Yeates | |
| 5,594,748 A | 1/1997 | Jabr | |
| 5,812,572 A | 9/1998 | King et al. | |
| 6,556,601 B2 * | 4/2003 | Nagata | 372/29.011 |
| 6,934,479 B2 * | 8/2005 | Sakamoto et al. | 398/193 |

* cited by examiner

*Primary Examiner*—Que T Le
(74) *Attorney, Agent, or Firm*—Weide & Miller, Ltd.

(57) ABSTRACT

A method and apparatus is disclosed for optic signal power control to maintain a desired or optimum optic signal power level. During start-up, a default or target value from memory may be utilized to bias or otherwise control operation of an optic signal generator or driver. During operation, pre-stored values may continue to be utilized or an open loop or closed loop control system may be utilized. An open loop control system may incorporate a temperature module or a timer module to account for changes in environment or changes due to aging that may undesirably affect system operation. A closed loop control system may incorporate one or more feedback loops that generate a compensation value to account for detected changes. In one configuration one or more peak values of the actual optic signal, or a portion thereof, are detected and processed to generate the compensation signal.

22 Claims, 16 Drawing Sheets

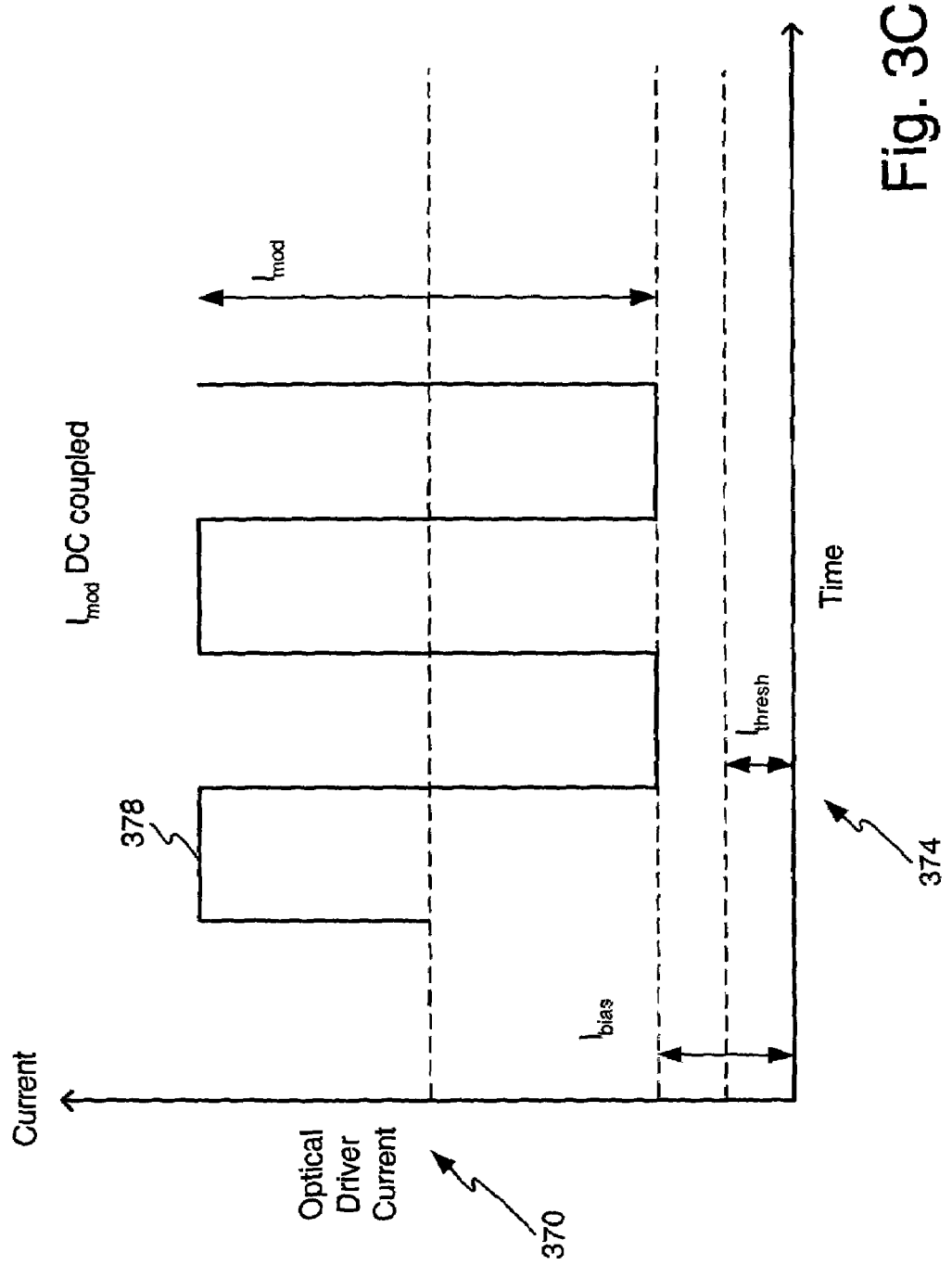

LASER POWER CONTROL WITH AUTOMATIC POWER COMPENSATION

FIELD OF THE INVENTION

The invention relates to optical signal generator output control and, in particular, to a method and apparatus for controlling optical signal generator output based on environmental or other factors.

RELATED ART

Many modern electronic devices and systems utilize optical signals to achieve desired operation. Examples of such devices include fiber optic communication systems, optical media read and write devices in computer and home entertainment systems, such as CD players and DVD players, and other devices that utilize a laser, photodiode, or other optical device.

As can be appreciated, these devices require highly precise operation and, with each generation of a product, a higher level of accuracy may be required to meet increasing demands in speed, storage capability, or data rate. Adding to the operational requirements, the environments in which such devices are required to operate are also subject to great variation. Optic devices, such as a laser transmitter or photodiodes have moved out of the laboratory and into everyday environments. Examples include optical communication systems, which may operate in remote locations or small and crowded equipment rooms and computer rooms, optical media readers found in automobiles and home environments, as well as optical systems in remote industrial applications which are remote and difficult to reach.

The varying environmental aspects of these varying locations present numerous hurdles for accurate device operation. One such hurdle is that device operation may be affected by temperature variation. Thus, as the environmental temperature changes, so do device operational parameters. Thus, the temperature change may cause the device to not meet specification and result in errors, reduced payload data throughput, or both. In some instances, the device may become inoperable. As can be appreciated, this is a serious drawback to device operation.

Other factors may affect the device operation in a similar manner. One such factor is the age of the device or the age of the components in the device. Over time, component behavior may vary and this variance my result in operation that does not meet specification.

The method and apparatus disclosed herein overcomes these drawbacks of the prior art and provides additional advantages as will be appreciated after reading the specification which follows in connection with the figures.

SUMMARY

To overcome the drawbacks of the prior art, a method and apparatus is disclosed for optic signal power control to maintain a desired or optimum optic signal power level. During start-up, a default or target value from memory may be utilized to bias or otherwise control operation of an optic signal generator or driver. During operation, pre-stored values may continue to be utilized or an open loop or closed loop control system may be utilized. An open loop control system may incorporate a temperature module or a timer module to account for changes in environment or changes due to aging that may undesirably affect system operation. A closed loop control system may incorporate one or more feedback loops that generate a compensation value to account for detected changes. It is further contemplated that the photodetector current or optic signal generator current may be monitored, such as in a closed loop feedback system to control the power level of the optic signal. In one configuration, one or more peak values of the actual optic signal, or a portion thereof, are detected and processed to generate the compensation signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis is instead placed upon illustrating the principles of the invention. In the figures, like reference numerals designate corresponding parts throughout the different views.

FIG. 3C illustrates an example plot of DC coupled driver current.

DETAILED DESCRIPTION

The method and apparatus disclosed herein overcomes the drawbacks of the prior art and provides additional advantages, features, and benefits. In general, an optical communication system is described herein as an example environment for the method and apparatus described herein. Although described in connection with an optical communication system, other environments that would benefit from the methods and apparatus described herein, such as, but are not limited to, optical media drives, laser surgery equipment, laser welding, free-space optical links and any other environment that utilizes an optical device.

Figure 1:
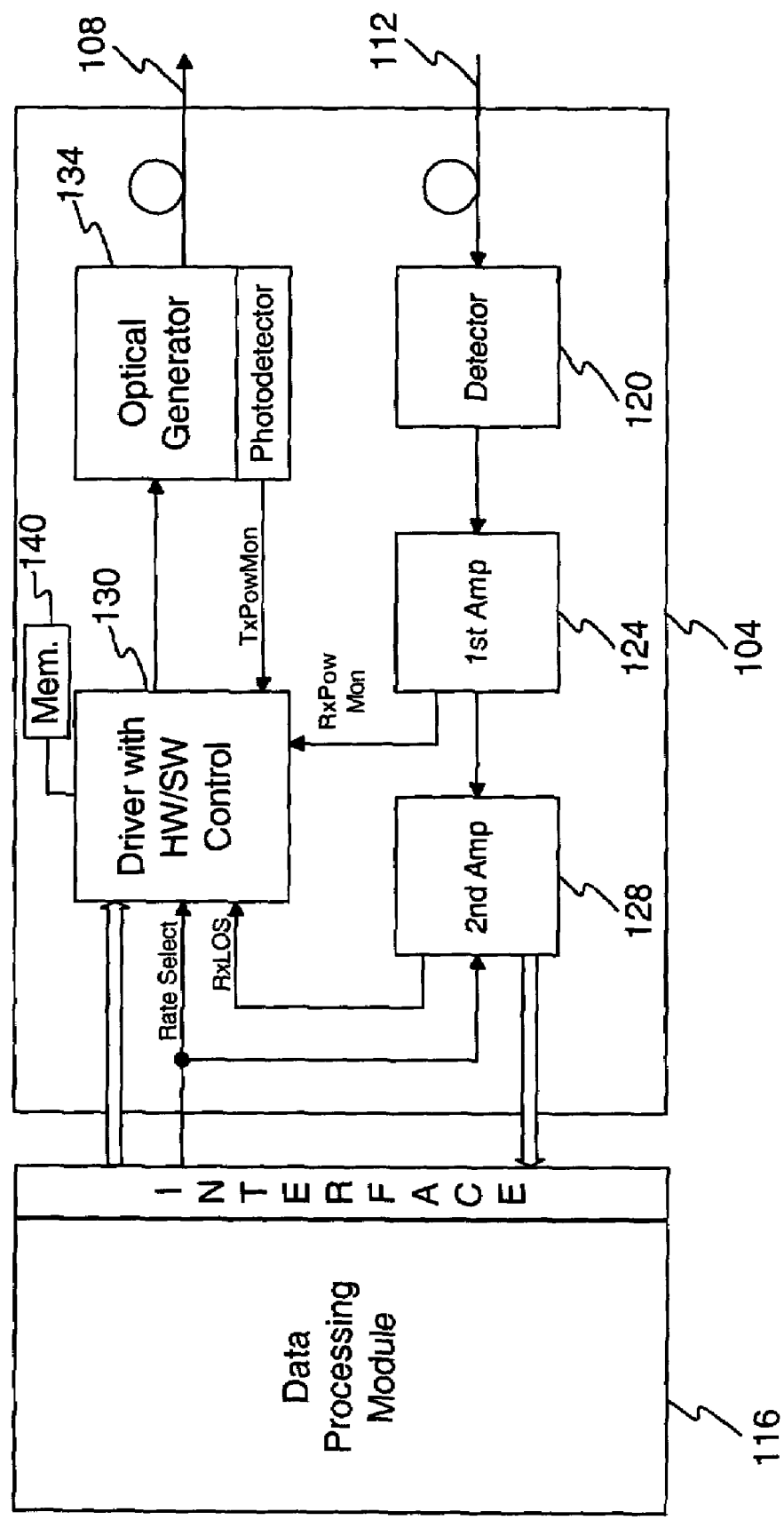
FIG. 1 illustrates a block diagram of an exemplary control module for an optical communication system.

Turning now to FIG. 1, a block diagram of an example module for an optical communication system is shown. The configuration shown in this Figure, and the other Figures provided herein, is but one possible configuration and, as such, it is contemplated that one of ordinary skill in the art may arrive at a different embodiment, configuration, or method of operation without departing from the scope of the claims. As shown, a transceiver with laser control 104 connects to one or more optic fibers, namely, an RX fiber 112 and a TX fiber 108. It is contemplated that the module 104 may comprise a single or multi-fiber module, and/or one which may have one or more wavelengths operating at the same time. The transceiver 104 also connects to a data processing module 116 having an interface. In this example embodiment, the processing module or interface 116 is configured to process the data prior to or after passing through the transceiver 104. When configured as a processing module 116, the module may be configured to frame/unframe, scramble/descramble, encode/decode, and/or to serialize/de-serialize data going through the interface. In addition, processing module 116 may at the same time decode LFSC (Low Frequency Side Channel) data. The interface may be configured to receive data from or provide data to one or more downstream processing modules or software layers.

In this example embodiment, the transceiver 104 comprises a detector 120 configured with an output that connects to a first amplifier 124, which in turn is configured with an output that connects to a second amplifier 128. The output of the second amplifier 128 connects to the processing module or interface 116.

In this example embodiment, the detector 120 comprises any type of optical detector configured to detect and convert an optical signal into an electrical signal. The first amplifier 124 may comprise a trans-impedance amplifier configured to convert a current magnitude to a variable voltage signal. The second amplifier 128 may comprise a limiting amplifier configured to accurately amplify the signal from the first amplifier, and frequently generates an industry-wide acknowledged level, for example: PECL, ECL, CML, PCML, LVDS and so forth 104.

With regard to the transmitter aspects of the transceiver 104, a Driver with HW/SW control 130 receives an input from the processing module 116 intended for transmission on the optical fiber 108. The Driver with HW/SW control 130 may perform one or more operations as described herein or analyze the signal while passing the signal to the optical signal generator 134. In this case, terms HW and SW in HW/SW control implies the use of either software or firmware. The optical signal generator may comprise any device configured to generate an optical signal. The Driver with HW/SW control 130 may optionally connect to one or more external or internal memory modules 140.

The Driver with HW/SW control 130 is configured in conjunction with the other components of a communication system, to perform numerous tasks to overcome the drawbacks of the prior art. In one embodiment, the Driver with HW/SW control 130 may be configured to monitor the power level or other aspects of the optical output signal and based on this monitoring, create a control signal that maintains optimal or desired power level output for the optic signal generated by the optic signal generator. In one embodiment, the Driver with HW/SW control 130 may be configured to process a timer or counter signal that relates the age or operational life of the generator 134 to the control signal value. In one embodiment, the Driver with HW/SW control 130 may be configured to monitor the extinction ratio or a low frequency signal channel signal and based on this monitoring modify the control signal. In one embodiment, the Driver with HW/SW control 130 may be configured to process a temperature value signal that relates the temperature of the generator 134 to the control signal value.

Figure 2:
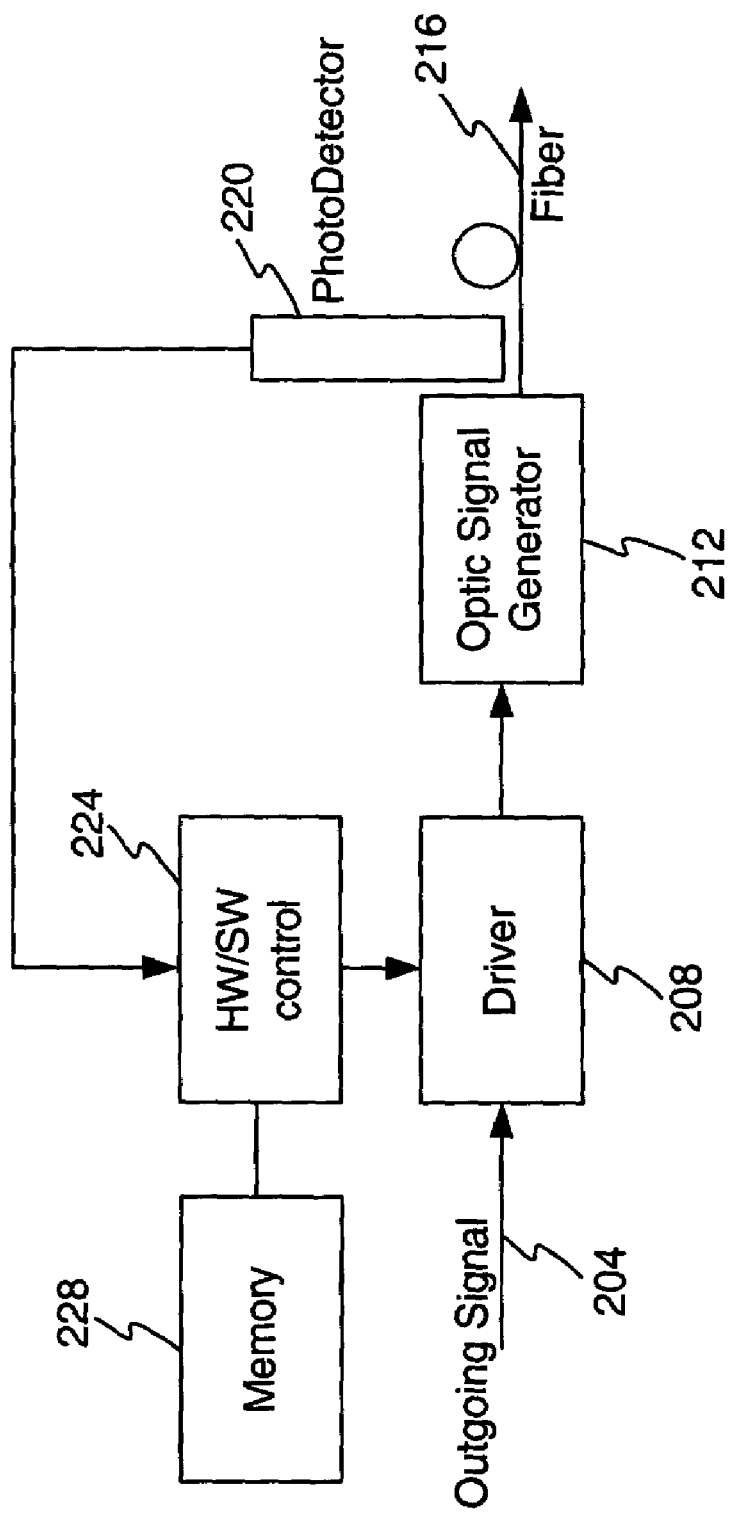
FIG. 2 illustrates a block diagram of an example embodiment of an optical signal power monitor and control system.

FIG. 2 illustrates a block diagram of an example embodiment of an optical signal power monitor and control system. As shown, an input 204 to the system provides an outgoing signal to an optical driver 208, which may comprise one or more devices configured to accurately drive an optic signal generator 212 as shown. The driver may comprise one or more amplifiers, current sources, voltage sources, peak detectors, comparators, as well as state machines used to control some or all of the aforementioned or any other device capable of processing or amplifying an outgoing signal into a signal capable of driving an optical signal generator 212. The optic signal generator 212 may comprise any type device capable of generating an optic signal in response to an electrical input. The optic signal generator 212 may comprise, but is not limited to, a laser, light-emitting diode, vertical-cavity-surface-emitting laser, or any electronic light emitting device. The output of the optic signal generator 212 is provided to one or more optic channels, such as an optic fiber 216.

A detector 220 is configured as part of the output structure or in some way associated with the optic signal generator 212 and/or fiber 216. The detector 220 is configured to detect the power level of the optic signal generated or output from the generator 212, the signal on the fiber 216, or both. The detector 212 may comprise, but is not limited to, a back-scatter detector, CdS photocell, PIN photo detector, avalanche photo detector, or any other optical device that changes resistance or developed current with exposure to visible, infrared, or ultraviolet light.

The output of the detector 220, which comprises an electrical signal that is in some way representative of the optic signal, is provided to a HW/SW control 224, which may comprise hardware, software, or firmware control, control logic, comparator, or any other structure. The HW/SW control 224 processes or analyzes the signal, and in response to the processing or analyzing, generates a feedback or control signal. In this embodiment, the feedback or control signal is provided to the driver 208 to thereby optionally control the driver to adjust the power level or other aspects of the input to the generator 212. In this manner, the power level of the optic signal, on the fiber 216, is monitored, controlled, and maintained at an optimal state.

This method of operation and this apparatus overcomes the drawbacks of the prior art by accounting for any changes in the power of the optic signal regardless of the reason for the change. Unwanted changes in output power in the optic signal, regardless of the reason or cause, are undesirable and result in increased jitter and/or error rates, lower payload bit rates or both. In some instances, such changes in output power, if not monitored and mitigated, may disrupt communication system operation. This method and apparatus has the advantage over systems that estimate the power level of the optical signal or monitor the electrical signal because this method and apparatus monitors the actual power level of the optic signal. As a result, a more accurate reading is obtained, instead of an estimation, thereby resulting in a highly accurate and dynamic control loop that adapts, in real time, to changes in environment or device operation. It is further contemplated that monitoring functions may be implemented in the controller 224 to monitor impending failure or indicate future problems. This may be reported prior to device failure, thereby increasing circuit up time.

Figure 3A:
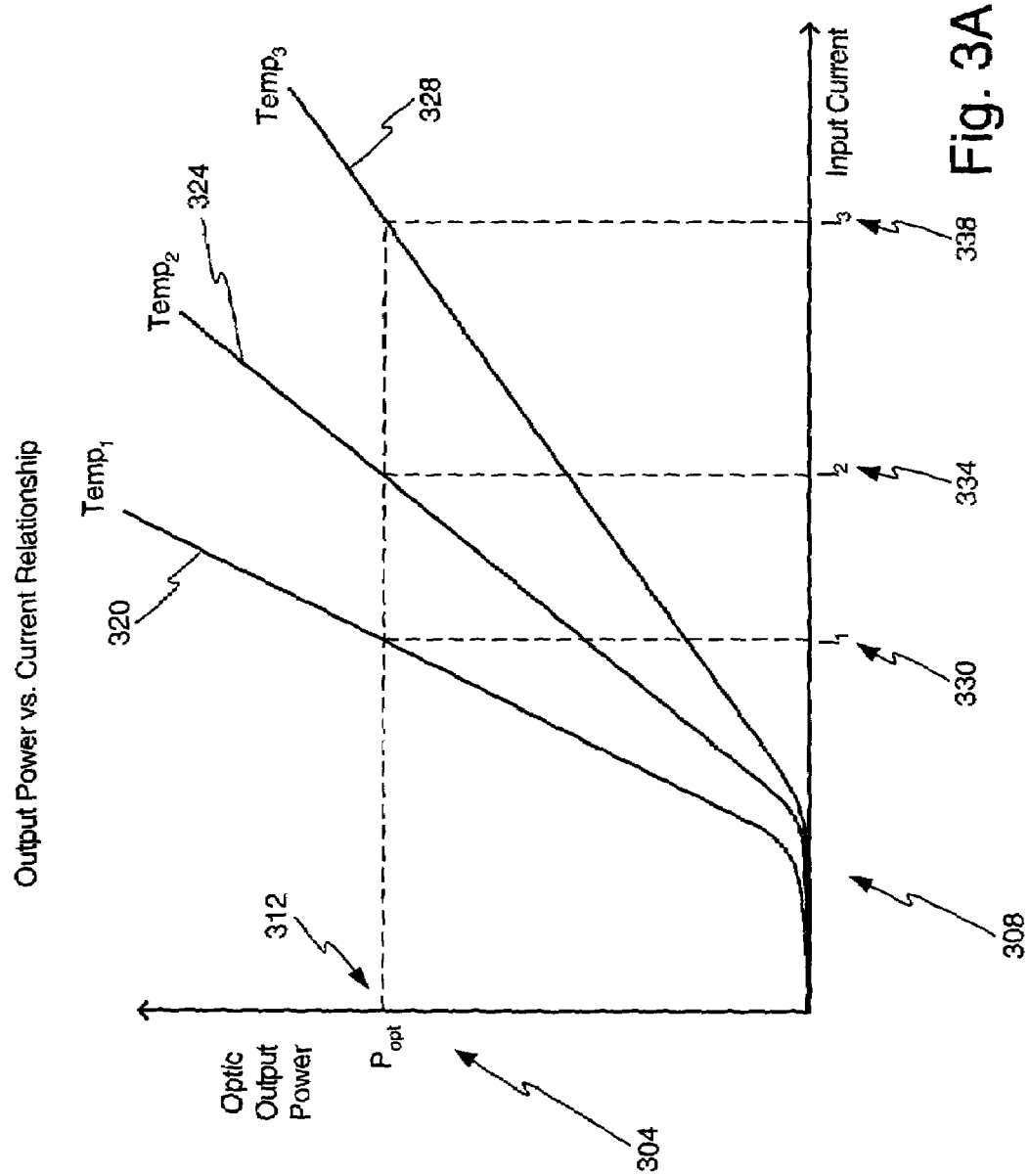
FIG. 3A illustrates an example plot of slope efficiencies for various temperatures for an exemplary optical generator.

FIG. 3A illustrates an example plot of output power of a laser or optical power generator device for various temperatures for an exemplary optical generator. These plots are provided for the purpose of discussion and as examples, and as such, the claims that follow should not be limited in any way by these plots. As shown, the vertical axis 304 represents optic signal output power while the horizontal axis 308 represents input current to the optic signal generator. Three plots 320, 324, 328 are shown. $Temp_1$ plot 320 represents the output power characteristics at a first temperature, while plots 324, and 328 represent output power characteristics at a second temperature $Temp_2$ and third temperature $Temp_3$ respectively. Output power characteristics include changes to threshold current and/or slope efficiency.

In one embodiment, the optimal optic signal power level is defined at power level 312. As can be appreciated from FIG. 3A, for the optimal power level 312 at the first temperature, the signal generator requires an input current $I_1$ 330 to generate this optic signal power level. At the second temperature $Temp_2$, shown by the plot of input current to optic signal output power, the optimal optic power level is achieved with an input current $I_2$ 334, which is different than current $I_1$ associated with $Temp_1$. Moreover, at the third temperature $Temp_3$, an input current $I_3$ is required to establish the optimal optic signal power 312. Thus, as the threshold current and/or slope efficiency changes, due to temperature variation, aging, or other unanticipated factors, so too does the required input current 308 to achieve an optimal optic signal power level 312. Consequently, input current, such as the output of device 208, as shown in FIG. 2, should also change. The method and apparatus is able to adapt to such changes in temperature, or any other reason, thereby maintaining optimal output power for the optic signal.

Figure 3B:
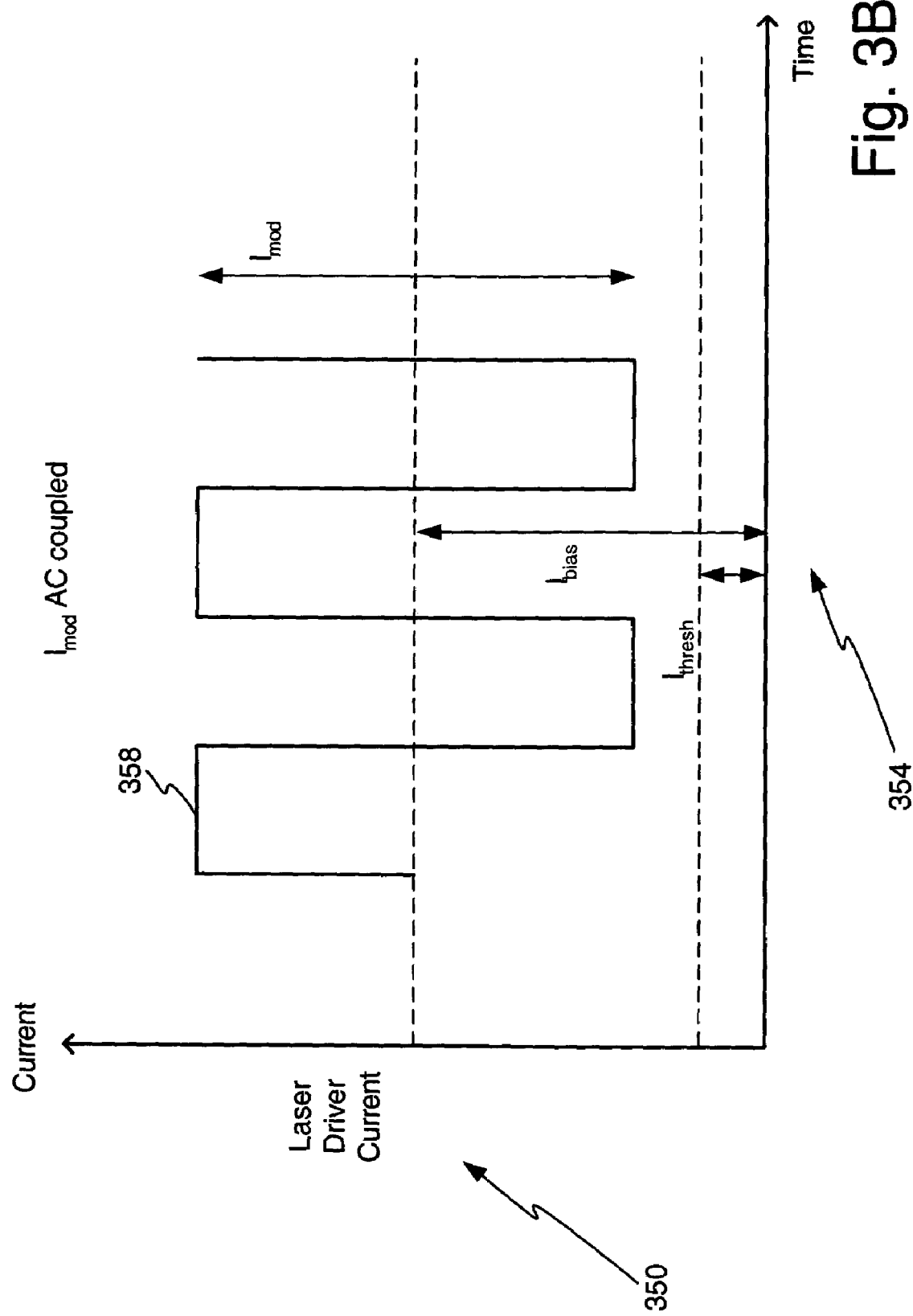
FIG. 3B illustrates an example plot of AC coupled driver current.

FIG. 3B illustrates a plot of an exemplary current driver signal with exemplary control current designations imposed thereon, when the laser driver current designated $I_{mod}$ is AC coupled to the optic signal generator. The term AC coupled is defined to mean that the $I_{mod}$ current is added to the $I_{bias}$ current, after removing the DC component of $I_{mod}$, in order to generate the total optical driver current. The vertical axis 350 represents optical driver current from the laser driver 208, as shown in FIG. 2, into the optical signal generator 212, as shown in FIG. 2, while the horizontal axis 354 represents time. A time varying optic signal 358 is shown as a reference. Controlling aspects of the optic signal 358 are currents $I_{thresh}$, $I_{bias}$, and $I_{mod}$. $I_{thresh}$ represents the turn on threshold current for the optic signal generator. $I_{bias}$ represents the bias current for the signal and controls the off level or DC level for the optic signal generator. $I_{mod}$ represents the modulation current for the optic signal and controls the variance between the peak minimum and maximum values for the optic signal. By controlling one or more of these values, the optic signal is likewise controlled or varied. One or more of these values may also be controlled to control the extinction ratio, which is defined as the ratio of two optical power levels, where the numerator of the ratio is the high level, and the denominator of the ratio is the low level. Extinction ratio is typically expressed in dB, but can also be expressed simply as a numerical ratio.

FIG. 3C illustrates an exemplary plot of a current driver signal when the laser driver currents designated $I_{mod}$ and $I_{bias}$ are DC coupled. The term DC coupled is defined to mean that the $I_{mod}$ current is added to the $I_{bias}$ current, without removing the DC component of $I_{mod}$, in order to generate the total optical driver current. As shown, the vertical axis 370 represents optical driver current while the horizontal axis 374 represents time. In this example plot, $I_{mod}$ current 378 is shown in reference to $I_{bias}$, $I_{thresh}$, and $I_{mod}$.

Figure 4:
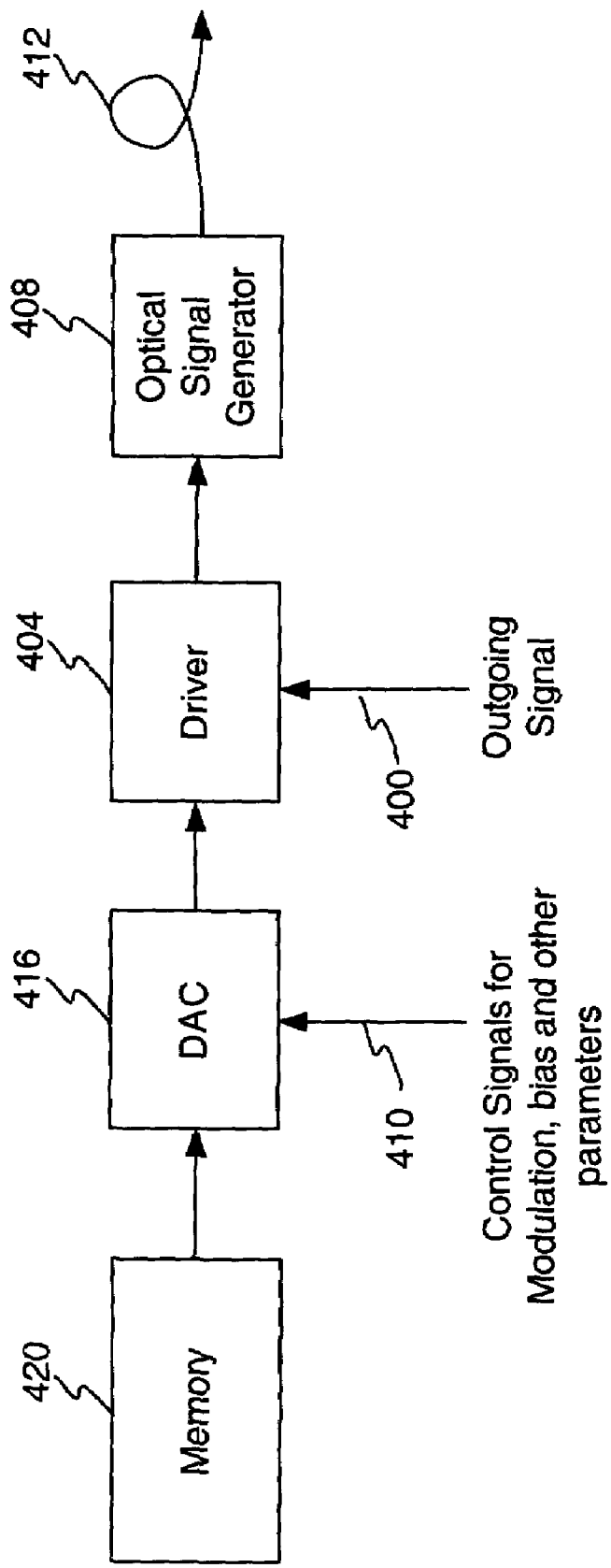
FIG. 4 illustrates a block diagram of an example embodiment of an open loop power control system.

FIG. 4 illustrates a block diagram of an example embodiment of an open loop power control system. This is but one example embodiment of an open loop power control system and, as such, other embodiments may be created without departing from the scope of the claims that follow. As shown, an input 400 carries an outgoing signal to a driver 404 configured to amplify or modify the outgoing signal in a manner suitable to power the optic signal generator 408. The optic signal generator 408 generates an optic signal, based on or representing the outgoing signal. The optic signal generator 408 outputs the optic signal on an optic fiber 412. As described above, the driver 404 and generator 408 may comprise any device capable of performing as described herein.

A memory 420 connects to a digital to analog converter 416, the output of which comprises one or more signals that are provided to driver 404. In operation, the memory 420 stores digital values which are output and converted to analog values, which in turn control one or more aspects of operation for the driver 404. It is contemplated that the aspects of the driver that may be controlled include, but are not limited to, the modulation current, the bias current, pulse width, edge characteristics, rise and fall time, and/or other aspects of the driver 404. In one embodiment, the values stored in the memory 420 may be referred to as control values or control signals because such signals or values in some way control one or more aspects of the driver or the driver output. It is contemplated that in some cases, there could be a control value to control the generator temperature via something like a thermoelectric cooler. However, in general, the control values themselves may be provided to another controller or driver device and not directly to generator 408. In one embodiment an input 410 connects to the ADC 416 to provide control signals for modulation, bias, or control of one or more other parameters.

As can be appreciated, the biasing level and/or modulation level may be controlled based on a memory value that is selected to control or drive the generator 408 in a desired manner. In addition, more than one control value may be utilized. For example, differing control values may be selected based on different factors, such as, but not limited to, time of day, age of components, components in use, temperature, system parameters, distance to receiving optic module and optic signal generator characteristics. As a result, the changes to any one or more factors may be accounted for by modifying the value in memory or utilizing a different value from memory.

It is also contemplated that the changes to the driver 404 or optic signal generator 408 may be accounted for by changes to the one or more control values stored in memory.

For example, for a different particular brand or lot of optic signal generator 408, a particular drive signal that is required to achieve optimum or an otherwise desired optical signal power level, extinction ratio, or any other desired parameter may vary. By changing the memory values to control operation of the driver 404, use of different components, such as a different type generator, may be accommodated without circuit redesigns. Instead, the memory value may be changed to account for the different circuitry or device.

Figure 5:
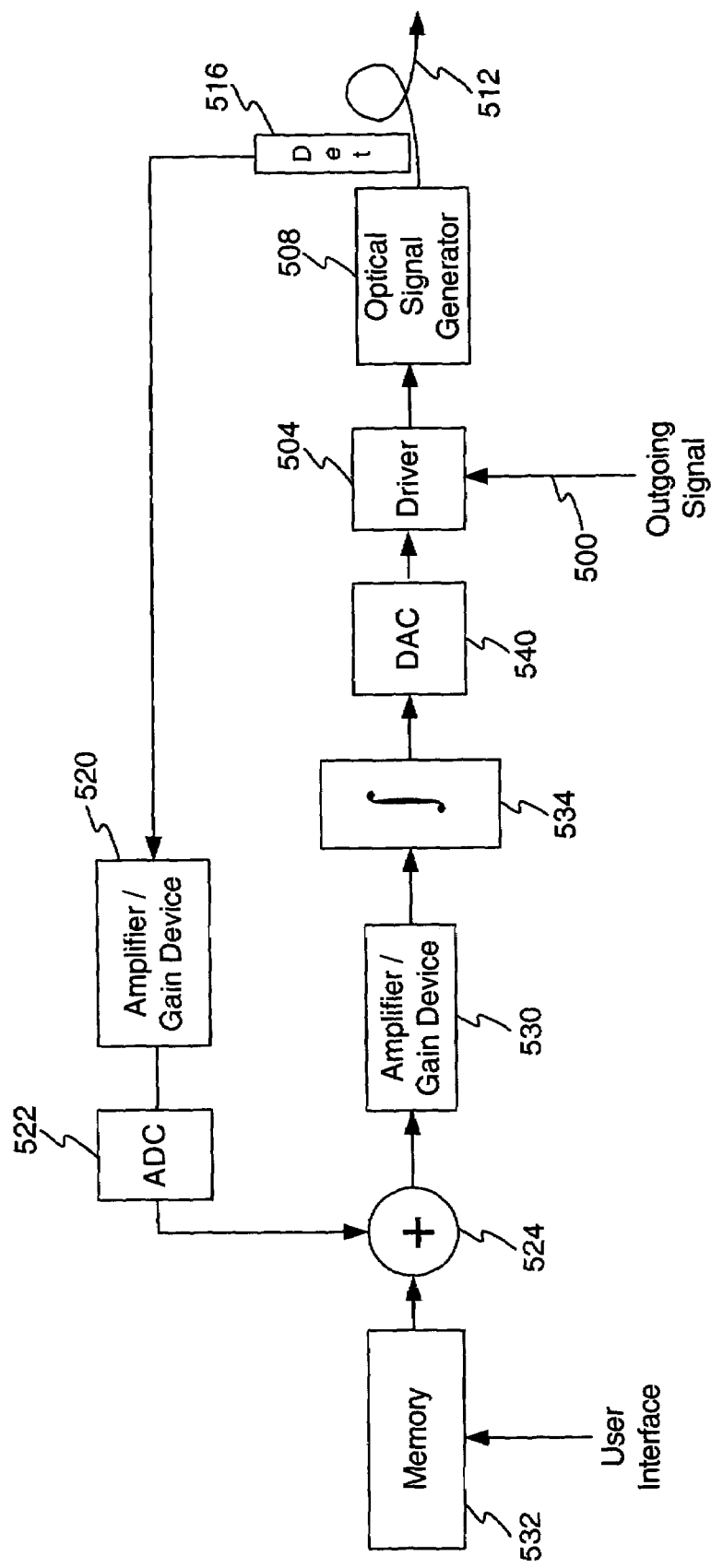
FIG. 5 illustrates an example embodiment of a closed loop power monitor to maintain optimal optic power.

FIG. 5 illustrates an example embodiment of a closed loop power monitor to maintain optimal optic power. As with all figures of the document, this figure is provided for purposes of discussion and, as such, the claims that follow are not limited to this particular embodiment. As shown, an input 500 configured to carry an outgoing signal is provided to a driver 504 configured to generate or modify the outgoing signal into a format suitable for powering or activating an optical signal generator 508 as shown.

The output of the generator 508 comprises an optical signal having parameters, such as power level and extinction ratio, controlled by the input from the driver 504 and the performance of the generator 508. The optic signal is provided to an optic fiber 512 for transmission to a remote station or other communication device, which may be co-located or remote. A detector 516 monitors one or more aspects of the optic signal, such as, but not limited to, power level or extinction ratio of the optic signal and converts the one or more aspects to an electrical signal, which in turn is provided to an amplifier 520 or some form of gain device. In addition, it is also contemplated that the detector 516 may detect the signal itself and generate an electrical representation of the optic signal on the fiber 512. The detector 516 may comprise a backscatter type detector, a PIN photo detector, avalanche photo detector, CdS photocell, any other optical device that changes resistance or develops current with exposure to light, or any other type of optic detector.

The amplifier or gain device 520 may comprise any device capable of modifying the power signal from the detector 516 for additional subsequent processing. The output of the detector 516 or amplifier 520 may be referred to herein as a feedback signal. The output from the amplifier 520 feeds into an analog to digital converter for conversion to a digital format and then to a summing junction or subtractor 524 configured to combine the feedback signal with one or more targets or control values or signals stored in the memory 532. The one or more target or control values or signals may comprise any of one or more values that are a starting point or default control values for the driver 504, such as to control bias current, modulation current, extinction ratio, power level or any other parameter of the driver, generator 508, or optic signal. The target value from the memory 430 is discussed below in more detail in connection with the operation of the embodiment shown in FIG. 5.

The one or more outputs of the junction(s) 524 are provided to an amplifier 530 or other type of gain device. It is contemplated that one or more junctions may be utilized to process one or more signals. It is further contemplated that the feedback signal may be converted to a digital signal by the analog to digital converter 522 or remain in the analog domain.

The amplifier 530 is configured to optionally modify the output(s) of the junction 524, such as by increasing or decreasing the magnitude of the signal, to a desired level. The junction 524 and the amplifier 530 may operate or be combined to generate an error signal, which may vary to either positive or negative. The output of the amplifier 530 connects to an integrator 534 or any other device configured to sum or combine the output from the junction 524 to generate a composite or integrated signal. The integrator 534 may comprise, but is not limited to, the following types of devices: accumulator, resistive/capacitive integrator, feedback loop, or nth order IIR filter. It is also possible to have a close loop system with the integrator bypassed and therefore have proportional signal control, or with an integrator signal+a proportional signal control, or with the proportional signal+integrator signal+higher order signal(s) control. The integrator 534 should be considered an optional device. In this embodiment, the integrator 534 may comprise a resistor/capacitor type integrator.

In this embodiment, the one or more outputs of the integrator 534 comprises one or more digital signals and, hence, a digital to analog converter (DAC) 540 which converts the digital signal to an analog format. As an advantage to the system described herein, at least a portion or all of the control loop is implemented in the digital domain thereby providing additional control, accuracy, and adaptability as compared to an analog solution. It should be noted that the one or more aspects may be implemented in the analog domain, or additional elements may be implemented as digital devices.

In operation at start-up, the feedback signal is zero and, as such, the memory 532 outputs the target value to the junction 524. As described above, the junction 524 combines or subtracts the feedback signal from the target value to thereby supplement the target value. At this stage, the feedback signal may be zero and, thus, the target value (i.e. one or more target values) is forwarded through the integrator 534 to the driver 504 to thereby control one or more aspects of operation of the driver. In this manner, the driver 504 is controlled by the one or more target values or signals to generate an optimum optic signal or an optic signal with the desired parameters to represent the outgoing signal.

During operation, the detector 516 detects the optic signal and generates an electrical feedback signal representative thereof, or representative of one or more aspects of the optic signal. The feedback signal and the target signal may comprise one or more signals and may be referred to herein as a value or a signal. The one or more feedback signals are amplified, converted to a digital value, and combined, either through addition or subtraction with the target value to supplement the target value(s). It is contemplated that over time the behavior of the generator 508 or other component may change and that this change may be undesirable as it may result in an optic signal that is other than optimal or does not meet specification. Consequently, the detector 516 will detect this change in the optic signal and the system through the feedback loop will supplement, either through addition or subtraction, the target value that was stored in memory 532 or a register. This modifies the target values, which may also be referred to as a control signal, which in turn affects the output from the driver 504 to account for or correct the behavior of the generator 508. The optic signal may deviate from optimal for other reasons, such as, but not limited to, temperature changes, or device behavior changes over time.

Regardless of the reason for the change in the power level of the optic signal, the detection method described herein detects such change because it advantageously monitors the actual optic signal and generates a feedback signal configured to return the optic signal to an optimal or desired state. Over time the feedback signal tracks the optic signal and continually corrects unwanted variations. This embodiment also has the advantage of allowing for user interface or input, such as modifications to the target value stored in memory via a user interface in conjunction with an open loop or closed loop digital format based on the optic signal control system. In addition, the feedback signal or any other aspect of the control loop may be monitored by one or more HW/SW control structures based elements to detect optic signal characteristics or feedback signal levels that may indicate an impending system failure or other condition.

Figure 6:
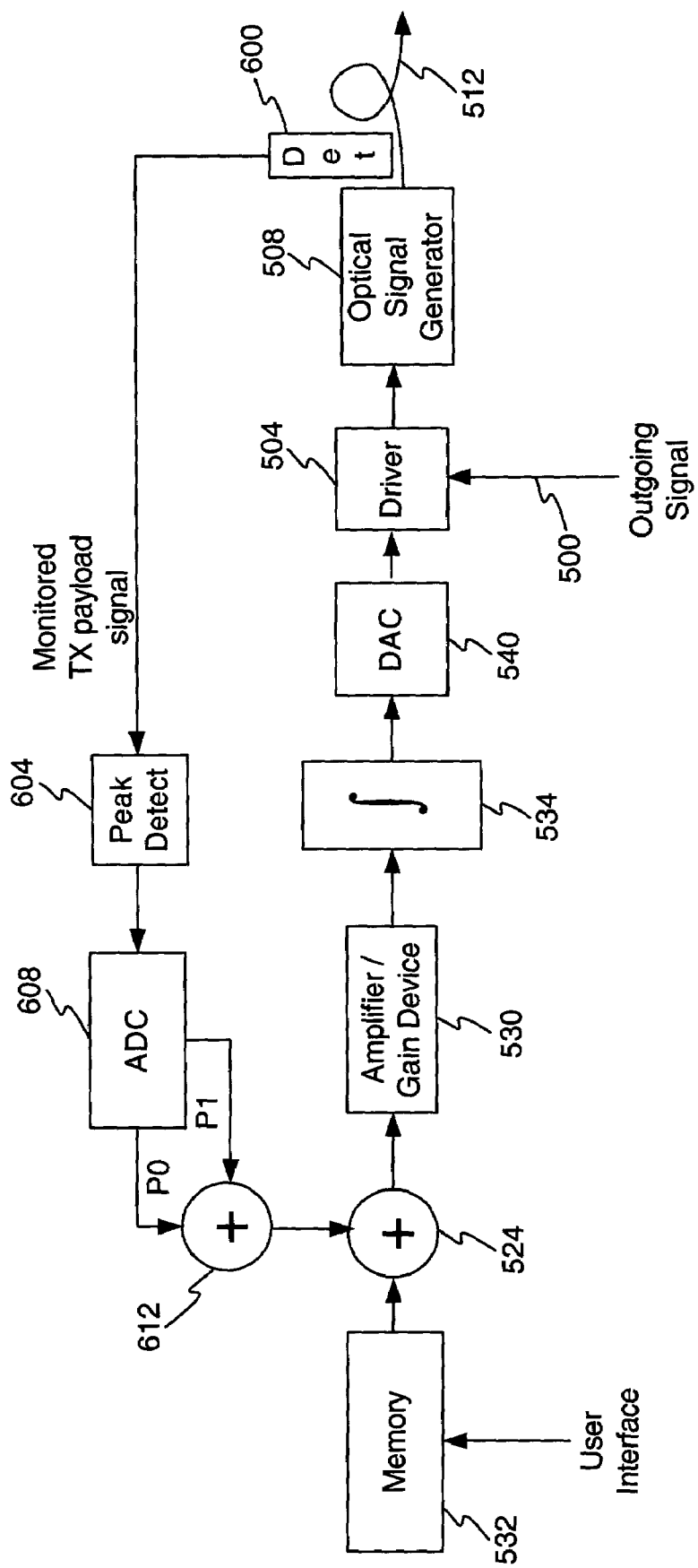
FIG. 6 illustrates a block diagram of an example embodiment of a closed loop power control system with data signal monitoring.

FIG. 6 illustrates a block diagram of an example embodiment of a closed loop power control system with data signal monitoring. As shown, this embodiment shares one or more similarities with the embodiment of FIG. 5 and, as such, similar items are identified with identical reference numerals. In this embodiment, the data signal, also referred to as the payload signal, is provided to a peak detector 604 in addition to other receiver systems, not shown, which process the signal. The data signal may be detected by a detector 600 or any other device or from an output from the optical signal generator 508. The signal is then provided to an analog to digital converter 608. The analog to digital converter 608 converts the feedback signal to a digital format, assuming the signal is not already provided in a digital format. The analog to digital converter 608 is configured to convert the $P_0$ and $P_1$ values for the received signal. In this embodiment, the values $P_0$ and $P_1$ are proportional, and represent, or may be processed to represent the extinction ratio. In one embodiment, the extinction ratio is defined as the fraction of the optical power of the marks (ones) to the optical power of the spaces (zeros) in decibels. The $P_1$ and $P_0$ may be defined as the power of the marks and spaces respectively. In one embodiment, it is desired to maintain the extinction ratio constant to avoid degradation or drift of the optic signal, which could lead to increased bit error rates.

Factors other than $P_0$ and $P_1$ maybe detected in other embodiments. By detecting $P_0$ and $P_1$, the modulation level may be detected. It is also contemplated that average power or any other aspect of the optic signal's power level may be detected. The one or more peak values are provided by the peak detector 608 to a junction 612, which, in this embodiment, determines the difference between the two or more peak values. This difference value, which may be modified in any manner by the junction 612, such as scaled, amplified, or decremented, or integrated, is provided to junction 524 as a feedback signal or compensation signal. This feedback or compensation signal may be used to modify one or more aspects of the optic signal transmitted from the generator 508.

In operation, an outgoing signal is provided to the driver 504 for conversion to an optical signal by the optical signal generator 508. The generator 508 generates an optical signal representative of the outgoing signal and one or more aspects of operation of the generator or of the optic signal is controlled by the control signal input from the DAC 540. The control signal is stored in the memory 532, which may be updated via the user interface. A compensation or correction signal, if necessary, from the feedback loop is combined with the control signal in the junction 524. The compensation signal is generated by monitoring the peak values, such as the modulation or $P_0$ and $P_1$, of the outgoing optical signal and generating the compensation or correction signal in junction 612. The compensation or correction signal may also be referred to as an error signal. The resulting control signal, which may be modified by the compensation or correction signal (i.e. feedback signal) is amplified in device 530, optionally integrated or summed in element 534 and converted to an analog format in converter 540.

If one or more parameters, such as the extinction ratio of the optic signal changes, such change is detected via the feedback loop (600, 604, 608, 612) and a compensation signal generated that when combined with the control signal or target signal from the memory 532 causes the optic signal to return to the optimal or desired power level. In this manner, the optic signal is monitored and maintained at an optimum level there by insuring a high bit rate, low error rate, and stable communication. This embodiment utilizes one or more peak detectors 608 to detect one or more aspects of the transmitted signal. Although in this embodiment, the values $P_0$ and $P_1$, which may be considered peak values, are monitored, in other embodiments, other factors, parameters, or peak values may be monitored to determine if the optic signal is within specification.

Figure 7:
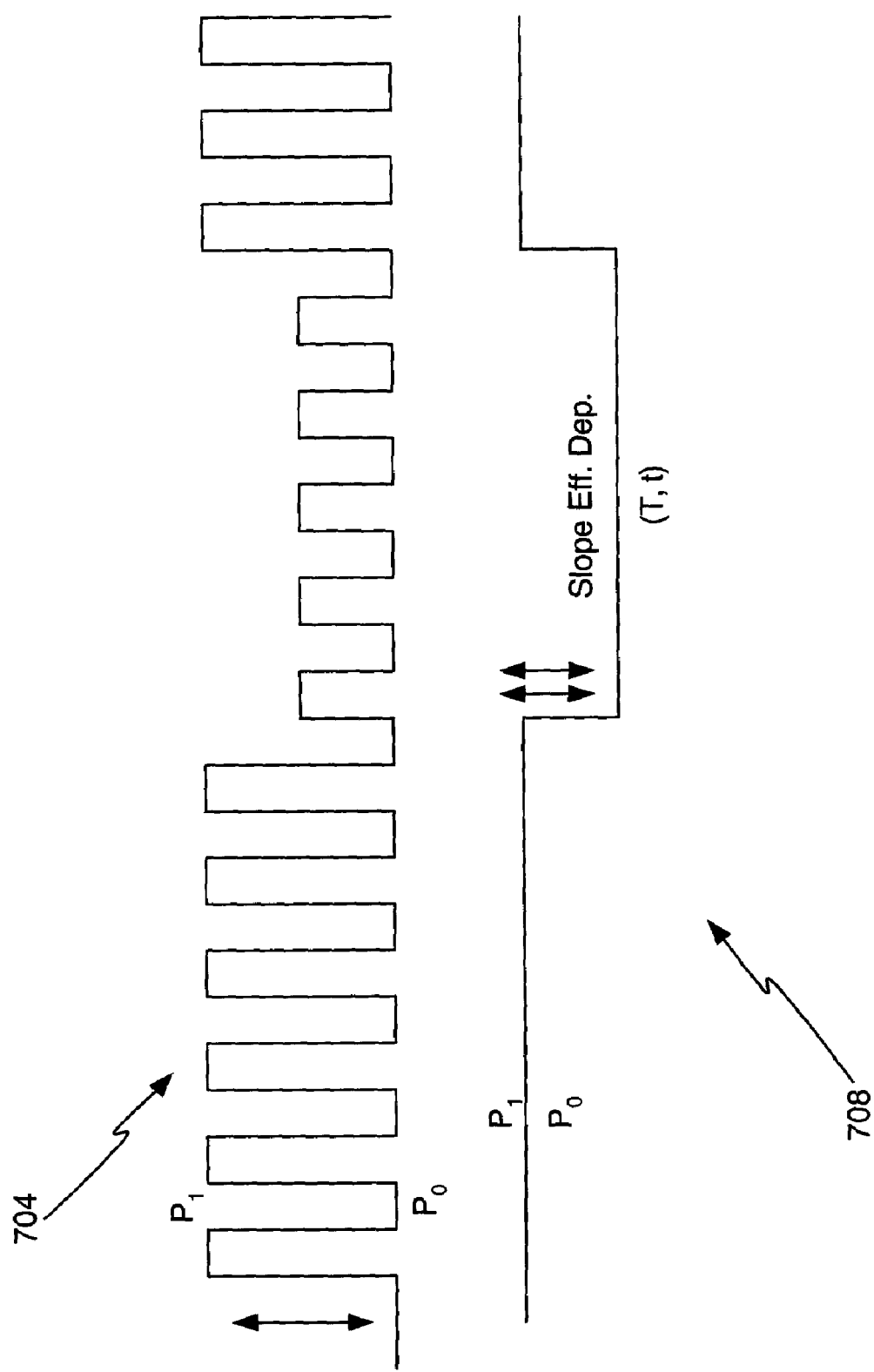
FIG. 7 illustrates an example plot of a data signal with an associated low frequency side channel (LFSC).

FIG. 7 illustrates an example plot of a data signal with associated low frequency side channel (LFSC). In one embodiment, the optic communication system may utilize a LFSC modulated onto or with the payload or data signal. As shown, plot 704 comprises a data signal while plot 708 comprises a LFSC signal that may be imposed or modulated onto the data signal 704. In one embodiment, the value for $P_{0d}$ and $P_{1d}$ for the data signal may be determined by monitoring the $P_{0LFSC}$ and $P_{1LFSC}$ for the LFSC signal where $P_{0d}$, $P_{1d}$, $P_{0LFSC}$ and $P_{1LFSC}$ are defined as signal levels proportional to the optical power in the spaces (zeros) of the data, marks (ones) of the data, spaces (zeros) in the LFSC data, and marks (ones) in the LFSC data respectively. Monitoring the LFSC signal provides the advantages of simplifying the peak detector circuitry and allows for communications via a link which is not dependent on payload data.

Figure 8:
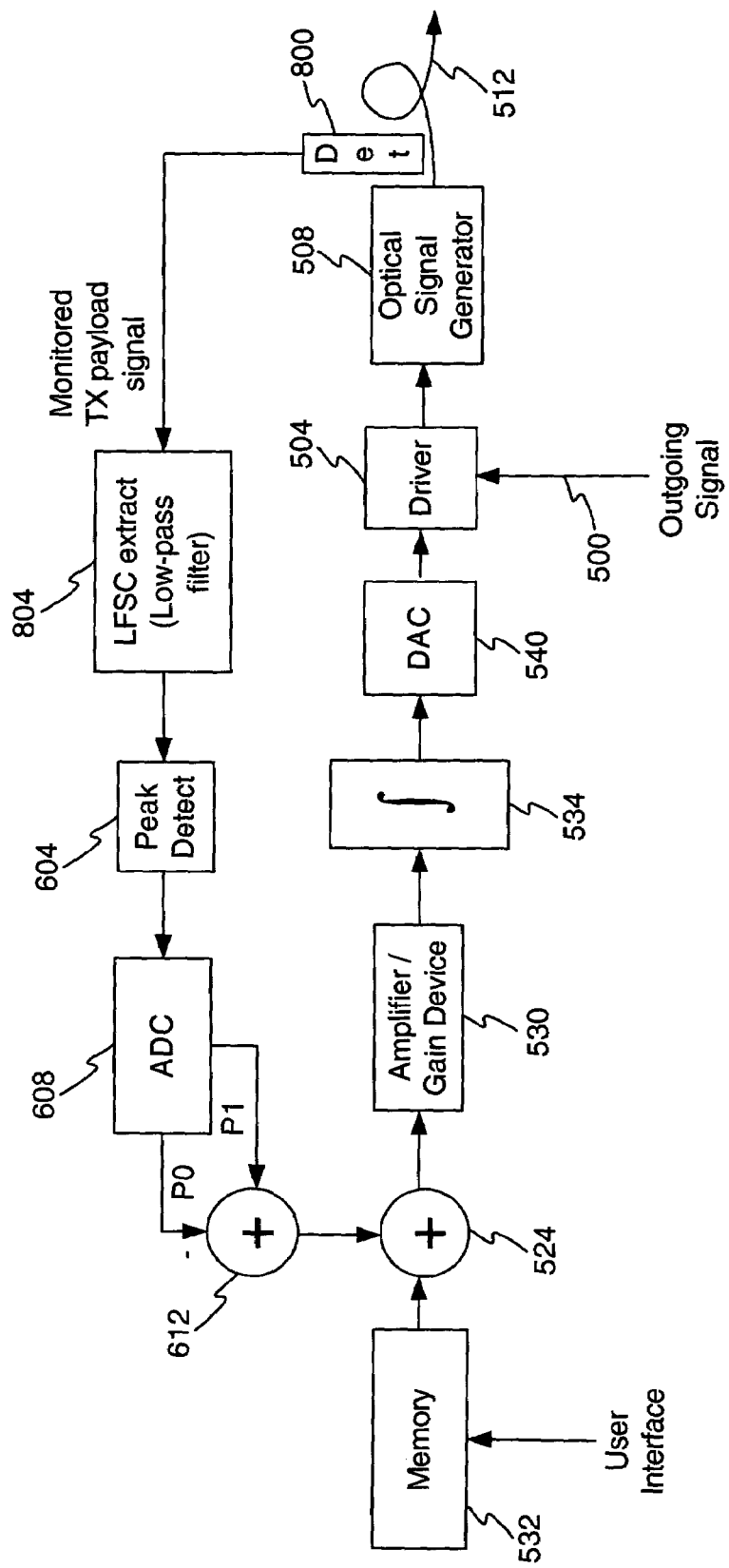
FIG. 8 illustrates a block diagram of an example embodiment of a signal power control system configured to monitor a LFSC signal.

FIG. 8 illustrates a block diagram of an example embodiment of a signal power control system configured to monitor a LFSC signal. As shown, this embodiment shares one or more similarities with the embodiment of FIG. 6 and, as such, similar items are identified with identical reference numerals. In this embodiment, the data signal, also referred to as the payload signal, i.e. outgoing signal, is provided to the driver 504 as is described above. The payload signal is created into an optic signal by the generator 508 and the optic signal provided to the fiber 512 may be detected by a detector 800 or any other device. The detection may also occur within the generator 508 or be a dedicated optic output from the generator. The detector 800 may be configured to detect the optic signal, which may comprise the data signal and the LFSC signal. The detector output is provided to a filter 804 or other processing apparatus configured to extract the LFSC signal. Thereafter, the LFSC signal is provided to a peak detector 604. The LFSC signal is then processed by an analog to digital converter 608 in a manner similar to that described above to isolate information regarding the modulation, extinction ratio, or other aspect of the optic signal. In the embodiment of FIG. 8, the signals $P_0$ and $P_1$ of the LFSC signal are isolated and provided to the junction 612 to generate a compensation or correction signal. In this embodiment, the extinction ratio of the LFSC signal may be considered as being related to the extinction ratio of the payload signal. This signal is in turn provided to the junction 524 where it may optionally adjust or supplement the driver control signal stored in memory 532.

Figure 9:
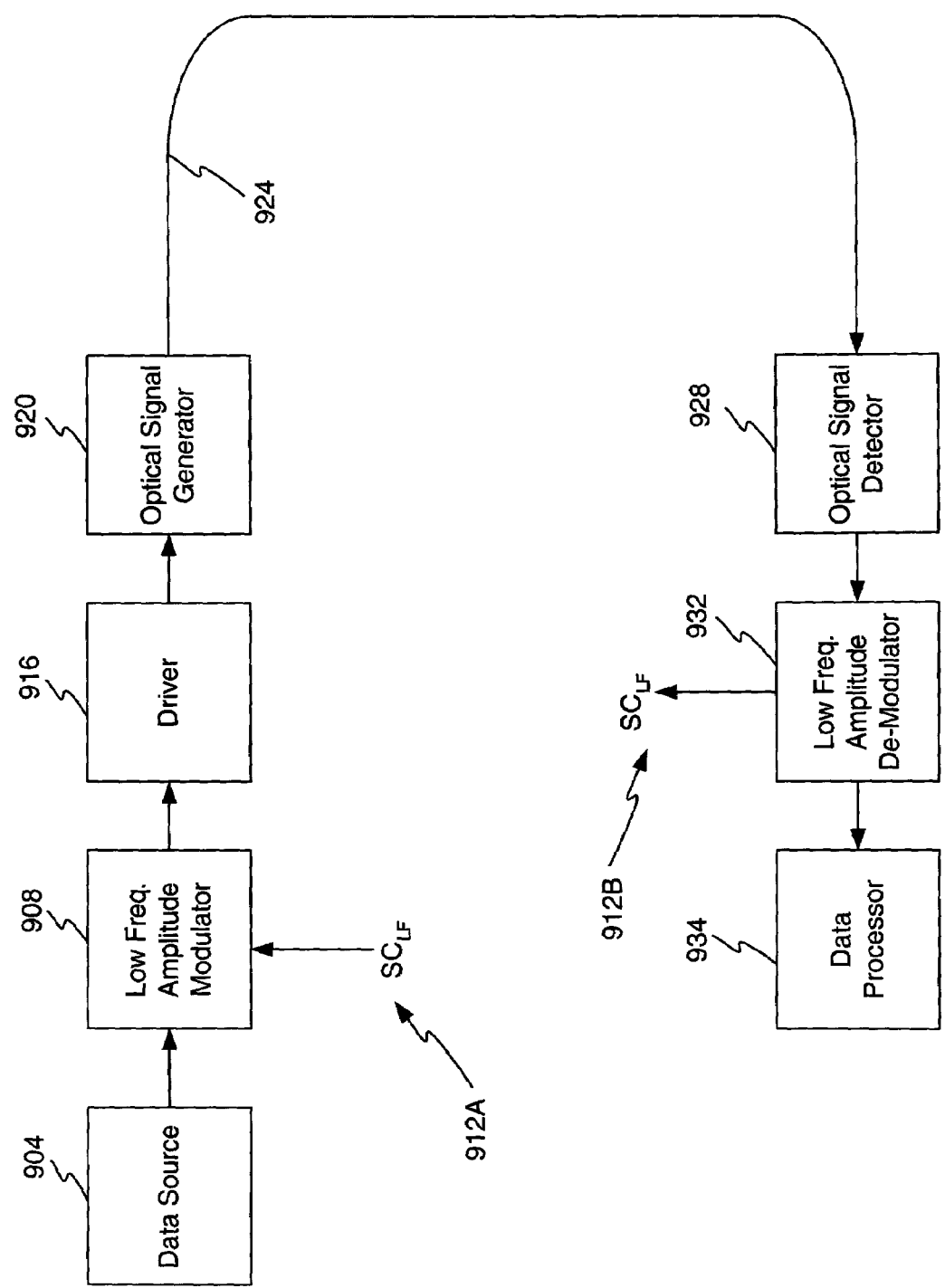
FIG. 9 illustrates a block diagram of an example embodiment of an optical communication system having an amplitude modulated low-frequency side channel configured to convey system data.

FIG. 9 illustrates a block diagram of an example embodiment of an optical communication system configured with an amplitude modulated low-frequency side channel configured to convey system data. In other embodiments, other methods of modulation may be utilized. As shown, a data source 904 provides network data for communication over the optical network. The data source 904 may comprise any source of network data including, but not limited to, a computer network, communication device router, switch, transceiver, hub, bridge, repeater, or any other source of data. The output of the data source 904 feeds into a low frequency amplitude modulator 908 which is configured to amplitude modulate data from a low frequency side channel 912A ($SC_{LF}$) onto the network data that is received from the data source 904. In one embodiment, the low frequency amplitude modulator 908 modulates the network data from the data source 904 responsive to the data on the side channel ($SC_{LF}$) and the data on the side channel may comprise system data, such as to control or monitor the communication system.

The output of the low frequency amplitude modulator 908 connects to a driver 916 that is configured to convert the amplitude modulated data source to a signal capable of driving an optical signal generator 920. It is contemplated that any type driver system or circuit 916 may be utilized. Likewise, the optical signal generator 920, which connects to one or more optical conductors 924, may comprise any device or system capable of generating one or more optical signals. Such devices include, but are not limited to, continuously modulated optical sources, such as, light-emitting diodes (LED) and various types of lasers, or they might be continuously emitting optical sources modulated by an external device, such as, electro absorptive modulator (EAM) or Lithium Niobate Modulator.

It is further contemplated that the system data in the form of the $SC_{LF}$ may be provided to the driver 916 to control operation of the one or more driver signals that are provided to the optical signal generator.

Because the network data from the data source 904 is amplitude modulated by the system data or secondary data on the low frequency side channel 912A, the fiber optic conductor(s) 924 concurrently carries the network data and the system data. Transmission of the system data in this manner does not disturb transmission or reception of the network data. It is contemplated that the intensity of the optical signal may be modified sufficiently so that the intensity changes may be detected to recover the system data, but not so significantly that the network data may not be recovered or that the data rate for the network data is reduced.

At a receiving station or at the detector, the combined signal is provided to an optical signal detector 928, which is configured to convert the optical signals to a corresponding electrical signal for subsequent processing. An amplifier (not shown in FIG. 9) may optionally be configured as part of the optical signal detector 928 or may reside after the detector 928 to amplify the received electrical signal.

The electrical signal is then provided to a low frequency amplitude demodulator 932 that is configured to detect the low frequency variations in the received signal to thereby isolate the system data on the low frequency side channel 912B. The system data recovery may also occur within an amplifier of the receiver. Because the system data controls the amplitude modulation of the network data, the system data may be recovered by monitoring one or more aspects of the received signal. After processing by the low frequency amplitude demodulator 932, the network data is forwarded to the data processor 934 which may be configured to process or otherwise utilize the network data. It is contemplated that the signal passed to the processor 934 may comprise the received signal. The amplitude modulation of the signal is such that it does not interfere with subsequent processing of the network data. In other embodiments, other forms of amplitude modulation may require processing of the network data by the data processor 934 in such a way to enable recovery of the received network data. These operations are described below in more detail.

The embodiment shown in FIG. 9 is but one possible example embodiment of a communication system utilizing amplitude modulation of a high frequency signal to encode or include additional data that, in this embodiment, comprises a low frequency side channel of system data. This enables transmission between stations to include system data including, but not limited to, data regarding the operation or performance of the optical signal generator, driver, the error rate, the transmit power, the extinction ratio, received signal, operating environment, or any other system parameters. Processing or monitoring of this data allows for inter-station communication to thereby adjust transmission or reception parameters of operation to either improve operation or monitor for potential failures or degradation. This low frequency signal channel may also be monitored by the detector to evaluate the power level of the outgoing optic signal.

Figure 10:
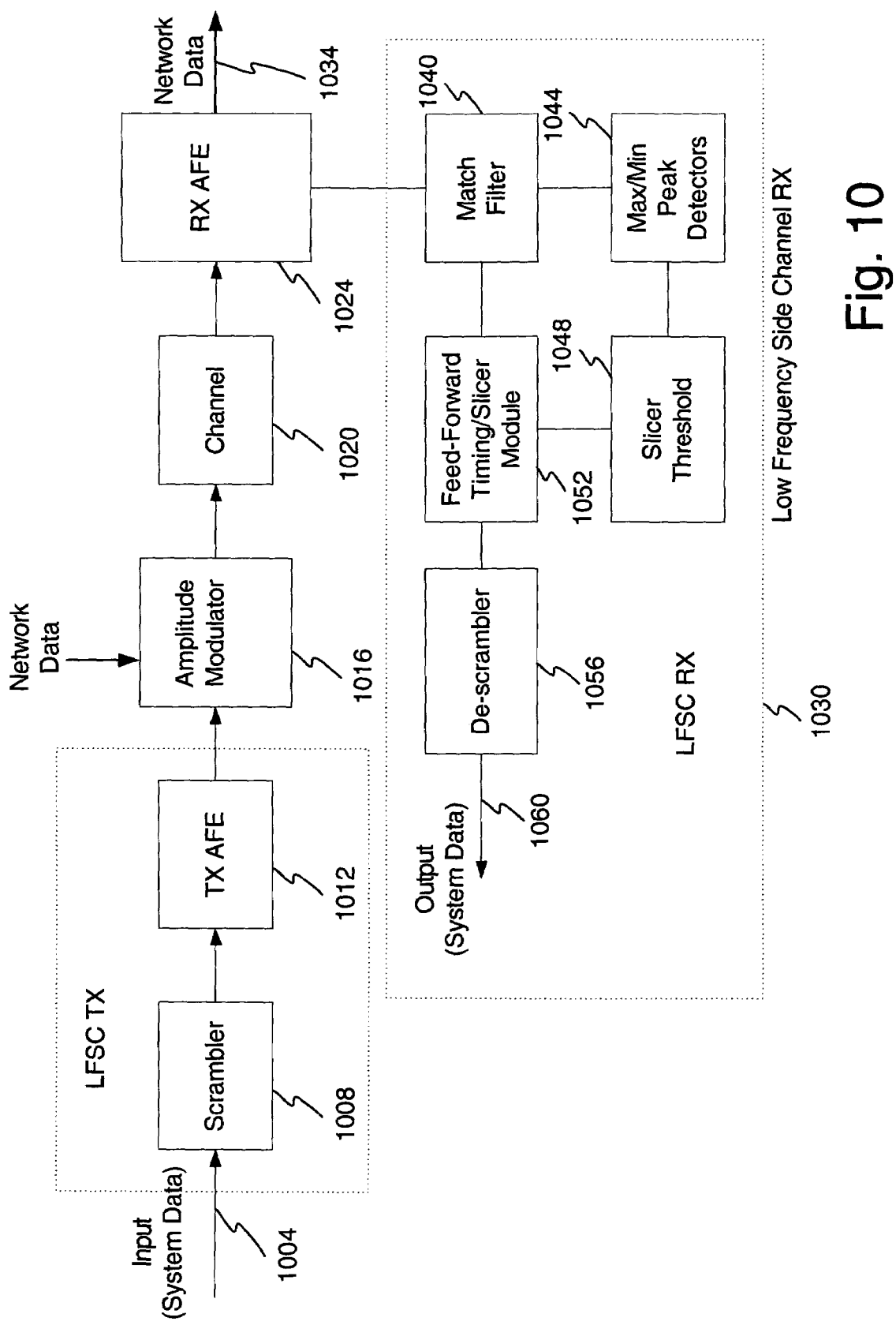
FIG. 10 illustrates a block diagram of an example embodiment of a transmitter-receiver pair configured to amplitude modulate network data to include system data.

FIG. 10 illustrates a block diagram of an example embodiment of a transmitter-receiver pair configured to amplitude modulate network data to include system data. The system of FIG. 10 may be utilized to incorporate low frequency side channel data with the data signal and this side channel data may be monitored to detect the optic signal power level. As would be understood by one of ordinary skill in the art, components in addition to those shown would likely be included to enable operation of such a communication system. In addition, the components shown in FIG. 10 comprise the components relevant to the present invention and those helpful to gain an understanding of the invention.

In the embodiment shown in FIG. 10, an input 1004 provides system data to a scrambler 1008. The scrambler 1008, which is known by those of ordinary skill in the art, processes the system data to inhibit undesirably long strings of logic value zeros or logic value ones which may otherwise disrupt system operation. The output of the scrambler 1008 feeds into a transmitter analog front end (AFE) 1012 which is configured to convert the digital network data to an analog format suitable for transmission over one or more channels, such as channel 1020. As is understood by those of ordinary skill in the art, digital data may be transmitted over a channel in an analog format.

The output of the analog front end (AFE) 1012 feeds into an amplitude modulator 1016 and is also configured as a signal generator. In one embodiment it is possible for the amplitude modulator to reside inside the AFE and the AFE could be an optical power generator or a current driver/optical power generator pair. In this embodiment, the amplitude modulator 1016 also receives system data as an input. The amplitude modulator 1016 is designed to concurrently transmit the system data and the network data over the channel 1020. Amplitude modulation of the system data onto the network data does not affect the communication system's ability to receive and detect the network data at a receiver.

In the embodiment shown in FIG. 10, the system data controls the amplitude modulation of the network data whereby depending upon the logic level of the system data, one or more aspects of the network data may be modified thereby causing the network data, when transmitted over the channel 1020 to convey not only the network data but also the system data.

In the embodiment of FIG. 10, it is contemplated that any type modification to the network data may occur that utilizes amplitude modulation techniques. For example, it is contemplated that the system data may control the bias level of the network data, the upper boundary intensity levels of the network data, the lower boundary intensity levels of the network data, the overall power level or bias level of the network data, or any combination of these factors. The various methods of operation of the amplitude modulator 1016 are described below in more detail.

The output of the amplitude modulator comprises an amplitude modulated version of the network data, which is provided to the channel 1020. It is contemplated that the channel 1020 may comprise any type communication channel and the channel may comprise one or more optical channels or additional electrical type conductors. It is also contemplated that the channel may comprise free space. Furthermore, channel drivers and optical signal generators may be located between the amplitude modulator 1016 and the channel 1020, although it is contemplated that the driver and signal generator may be part of the apparatus performing the amplitude modulation of the network data. As such, the amplitude modulator may also then be configured as the driver and signal generator.

Turning now to the receiver side of the transmitter-receiver pair, a receiver analog front end 1024 processes the received amplitude modulated network data as would be understood by one of ordinary skill in the art. The network data, which may also include the amplitude modulation effects, is provided on output 1034 for subsequent processing. Amplitude modulation does not interfere with subsequent processing of the network data because the degree of amplitude modulation occurring on the network data is not significant enough to interfere with subsequent processing but is significant enough to be detected by the low frequency side channel receiver 1030, which also receives the amplitude modulated network data as shown.

The low frequency side channel receiver comprises a match filter 1040 configured to receive and selectively filter a particular frequency band of the output from the analog front end 1024. The match filter 1040 also connects to a feed-forward timing module 1052 and a min/max peak detector 1044. The min/max peak detector 1044 also connects to a slicer threshold 1048, which in turn connects to the feed-forward timing/slicer module 1052 as shown. The output of the feed-forward timing/slicer module 1052 feeds into a de-scrambler 1056 configured to reverse the effects of the scrambler in the transmitter. The system data is shown on output 1060 after having been recovered by the low frequency side channel receiver.

In operation, the match filter 1040 comprises a filter that is tailored to have a frequency response of a particular frequency or frequency band. In this embodiment, the RX AFE 1024 separates the low frequency system data from the network data. By detecting the amplitude modulation of the network data, the system data may be recovered. The min/max peak detectors 1044 monitor one or more aspects of the recovered system signal. In this embodiment, the min/max peak detectors 1044 monitor the maximum and minimum values of the system data to thereby detect the proper levels for the slicer threshold. The feed-forward timing/slicer module 1052 and slicer threshold 1048 operate to thereby generate the output signal provided to the de-scrambler 1056. In other embodiments, other configurations for and methods of operation of the low frequency side channel receiver 1030 may be utilized. As discussed below in more detail there are numerous methods by which the system data may be utilized to modulate the network data and, as such, the configuration and operation of the low frequency side channel receiver is dependent upon the particular method of amplitude modulation utilized. For example, it is contemplated that max/min peak detectors inside the RX AFE 1024 may comprise a power monitor configured to monitor the average power or bias level of the modulated network data and based on this average power or bias level the system data may be recovered.

It should be noted that the low frequency side channel data is at a frequency rate which is below the network data. In one embodiment, the frequency of the system data is 100 times slower than the frequency of the network data. Thus, for every data sample of system data, there may be 100 or more samples of network data. In one example embodiment, the system data is provided at a rate of 1000-10,000 Hertz while the network data may be at 1 GHz or higher frequency. In one embodiment, the network data is at a rate that is greater than 10 times the data rate of the system data. As can be appreciated, there will be numerous samples of network data for each system data sample and, because of the use of the scrambler 1008, the system data will include numerous logic zero values and numerous logic one values. In such an embodiment, regardless of the particular amplitude modulation scheme utilized, the system data can be recovered.

Figure 11:
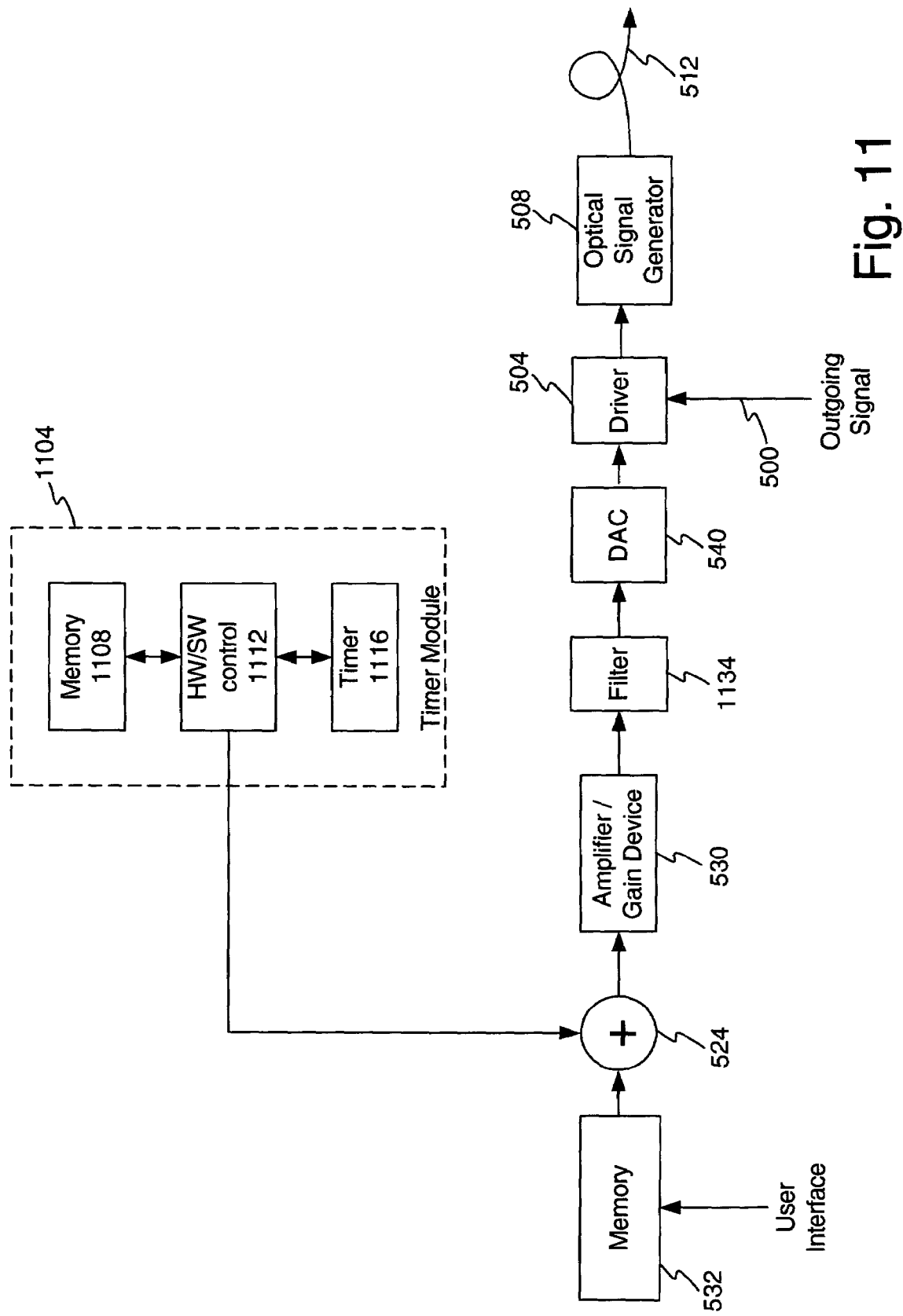
FIG. 11 illustrates a block diagram of an example embodiment of an optic signal power control system with a timer control system.

FIG. 11 illustrates a block diagram of an example embodiment of an optic signal power control system with a timer module. As shown, this embodiment shares one or more similarities with the embodiment of FIG. 5 and other embodiments, and as such, similar items are identified with identical reference numerals. Elements that are described above are not described again.

In this embodiment, the driver control structure described above receives a compensation or correction signal from a timing module 1104. In this example embodiment, the timing module 1104 comprises a memory 1108, a HW/SW control 1112 and a timer 1116. As shown, the timer 1116 comprises any element or device capable of tracking the in-service time, operational time, or age of the generator 508 or other components or systems. Any type device, such as, but not limited to, a timer, counter, clock, crystal, or periodic waveform generator may be utilized as the timer 1116.

The output of the timer 1116 comprises a signal representing the in-service time of the generator 508 or some other indicator of the generator's age, which may be an in-service time or an age value regardless of time that the generator has actually been in use. The HW/SW control 1112 operates in connection with the memory to analyze the time value from the timer 1116. In one embodiment, the HW/SW control 1112 utilizes the timer value as the compensation or correction value. In one embodiment, the HW/SW control 1112 processes the timer value into the compensation or correction value. In one embodiment, the HW/SW control 1112 utilizes the timer value as a look-up value to perform a look-up in memory 1108 to thereby retrieve a compensation or correction value stored in the memory. It is contemplated that in one embodiment, the HW/SW control 1112 may compare the timer value to a threshold time value, which may be stored in memory 1108 and if the time value is less than the threshold, then no compensation or correction signal is output, or a zero value is output.

The compensation or correction value is output to the junction 524 to modify the one or more control values from the memory 532. One or more compensation or correction values may be output from the timer module 1104. The other aspects of the system shown in FIG. 11 operate as described above. However, because this is an open-loop control system, the integrator 534 has been replaced with a filter 1134.

As described above, optic signal generator output power verses input current swing characteristics, such as, for example, the slope efficiency, is a function of temperature and device lifetime, i.e. the age of the generator. The temperature dependence of the slope efficiency may be intrinsic to the type of optic signal generator. Typically, the slope efficiency of the output power versus input current curve decreases as the temperature increases. Moreover, the slope can have a wide process variation range. If the slope efficiency changes, such as, in response to temperature changes, then the optical signal generation may generate a signal that has a different extinction ratio, which is related to slope efficiency, and which may be out of specification. In addition, different generators may also have different slope efficiencies, which may cause the optic signal power level to be at other than an optimum level. As a result, it may be desired to account for changes in temperature or performance differences between devices or circuits. By way of background, the extinction ratio is defined as the fraction of the optical power of the marks (ones) to the optical power of the spaces (zeros) in decibels. In one embodiment, it is desired to maintain the extinction ratio constant to avoid degradation or drift of the optic signal, which could lead to increased bit error rates.

Figure 12:
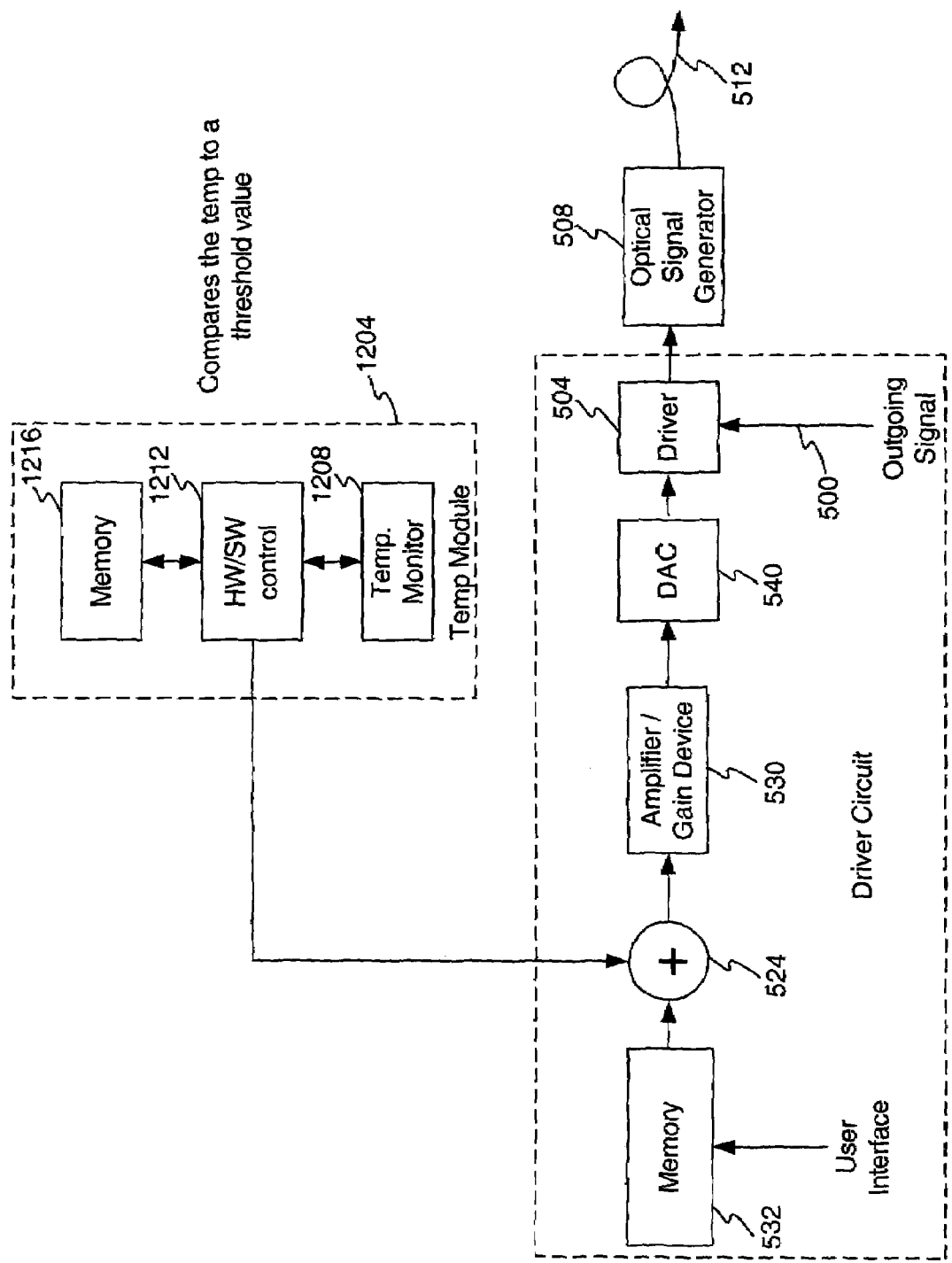
FIG. 12 illustrates a block diagram of an example embodiment of an optic signal power control system with a temperature module.

In one embodiment, the drawbacks and problems of the prior art may be overcome by utilizing a temperature module. FIG. 12 illustrates a block diagram of an example embodiment of an optic signal power control system with temperature monitor. As compared to FIG. 5, similar or identical elements are labeled with identical reference numbers. In this example embodiment, a temperature module 1204 comprises a temperature module 1208, a HW/SW control module 1212, and memory 1216. Other embodiments may adopt other configurations.

The temperature monitor 1208 comprises a device configured to output a signal, either digital or analog, representative of the temperature. The monitor 1208 may be external to the integrated circuit or configured as part of or built into the power control integrated circuit. Any type temperature monitor 1208 may be utilized and it may be calibrated, if necessary, in any manner.

The memory 1216 is configured to store one or more temperature threshold values. The temperature threshold values ($T_{thresh}$) may comprise one or more values representing a temperature value at which further increases in temperature will affect signal generator operation. Thus, it is contemplated that in one embodiment, for temperatures above the threshold value, the optical signal generator may behave differently, due to a different slope efficiency, and thus, compensation may be desired or necessary. Reference to FIG. 3A may be helpful in understanding this principle. The process, which may be employed by the embodiment of FIG. 12, is described in more detail below in connection with FIG. 13.

The output of the temperature monitor and the memory 1216 are provided to the HW/SW control module 1212. In one embodiment, the HW/SW control module 1212 is configured to compare the threshold value to the temperature monitor, and based on the comparison, output a temperature module output to the driver circuitry as shown. The temperature module output may comprise any type control signal or error signal. In one embodiment, the output of the temperature module 1204 comprises the threshold value or a zero value if the temperature is below the threshold temperature or a compensation value if the temperature is above the threshold temperature.

In addition, it is contemplated that the HW/SW control module 1212 may comprise logic and one or more comparators to perform a comparison between the threshold value and the temperature monitor value of the actual temperature.

The one or more outputs of the temperature module 1204 feeds into the junction 524 to thereby supplement or decrement the driver control values output from memory 532. It is also contemplated that the temperature module 1204 may output a zero value. Operation of the remaining elements may occur in a manner generally similar to that described above.

In this particular embodiment, however, the system is configured as a first order type system and, as such, higher order terms in temperature are not utilized (such as $T^2$, $T^3$, ... $T^N$). In other embodiments, the system may utilize second order or higher order temperature terms. (This is not a closed loop system so the integrator could make the system unstable as it will never have zero as an input. Higher order here refers to the use of higher order non linear terms of the independent variable temperature)

It is further contemplated that in one configuration or method of operation, the memory 1216 and HW/SW control module 1212, or any processor or controller, may be configured to store and process one or more equations or calculations and using these equations or calculations and the temperature monitor input, the system may arrive at desired or optimal compensation value to be provided as the temperature module output. By way of example, and not limitation, one or more equation coefficients may be stored in the memory 1216. The equations may comprise first through Nth order polynomials in temperature or temperature monitor value, where N comprises any positive whole number. In one embodiment, the following equation coefficients may be utilized, in conjunction with the detected temperature value from the temperature monitor and its higher order terms to calculate a compensation value to be output from the module 1204.

$C_T(T) \approx C_1 T + C_2 T^2 + \ldots + C_N T^N$. Where $C_T(T)$ is the compensation signal going to the junction 524, the coefficients $C_N$ for any integer N are stored in memory and T is the temperature value from the temperature monitor.

The coefficients $C_N$ may be arrived at utilizing least mean squared method, optimization methods, or any other type analysis. It is further contemplated that the coefficients may be arrived at using product data sheets, such as a data sheet for a particular signal generation device, or from in lab analysis and testing. In this manner, the system may be quickly and accurately tailored to any optic signal generator 508 or driver circuit, which may also suffer a performance change as the temperature changes.

The embodiment shown in FIG. 12 is an example embodiment and, as such, it is contemplated that one of ordinary skill in the art may arrive at different variations or arrangements without departing from the scope of the claims that follow. For example, the memory 1216 and memory 532 may be combined into a single memory module or separated into two or more elements as shown. In addition, the memory 1216 may be considered optional.

Figure 13:
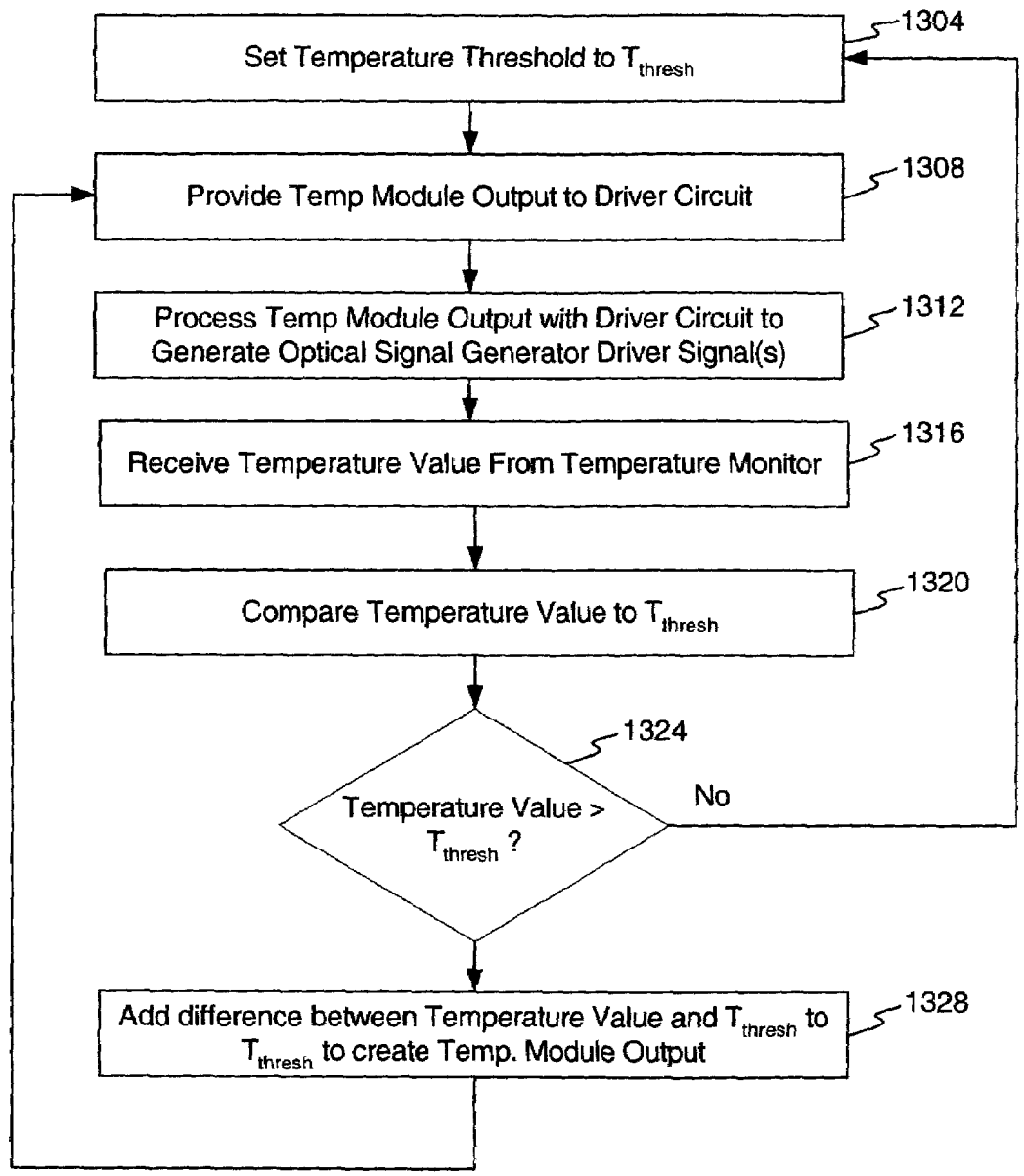
FIG. 13 illustrates an operational flow diagram of an example method of operation of a temperature controlled feedback system for optic signal power control.

FIG. 13 illustrates an operational flow diagram of an example method of operation of one example embodiment of the system shown in FIG. 12. As described above, other example methods of operation are possible in addition to the method described below. In addition, the structure of this method may be applied to methods, which monitor the optic signal power level, but which do not utilize a temperature monitor, such as, but not limited to, timer based systems or feedback based systems.

At a step 1304, the system sets the temperature module output to the temperature threshold value ($T_{thresh}$) as may be stored in memory. This may be considered as happening at startup or other specified times.

At a step 1308, the system provides the temperature module output to the driver circuit, such as to the junction 524 (FIG. 12). The output from the temperature module may comprise a compensation value. Thereafter, at a step 1312, the driver circuit may process and utilize the compensation value to generate an optical signal generator driver signal or a control signal that controls the driver. In this manner, the power of the optic signal is controlled.

Next, at a step 1316, the controller or processor receives the temperature value, representing the actual temperature, from the temperature monitor. At a step 1320, the operation compares the actual temperature value, from the monitor, to the threshold value. If at step 1324, the temperature value is less than or equal to the threshold value, then the operation returns to step 1304 and the threshold value is utilized as the output. Alternatively, instead of the threshold value being utilized, a zero value, or other value stored in memory may be utilized as the output from the temperature module or as a compensation value.

Alternatively, at a step 1324, the operation may determine that the temperature value is greater than the threshold value and, as such, the operation may advance to step 1328. In this embodiment, at step 1328, the system adds the difference between the temperature value and the threshold value to create the temperature module output. Alternatively, the difference value, or some other value, may be output as a compensation signal.

After step 1328, the operation will return to step 1308 and repeat as necessary during operation to compensate for changes in temperature and the effect these changes have on the optic signal generator or the driver.

Figure 14:
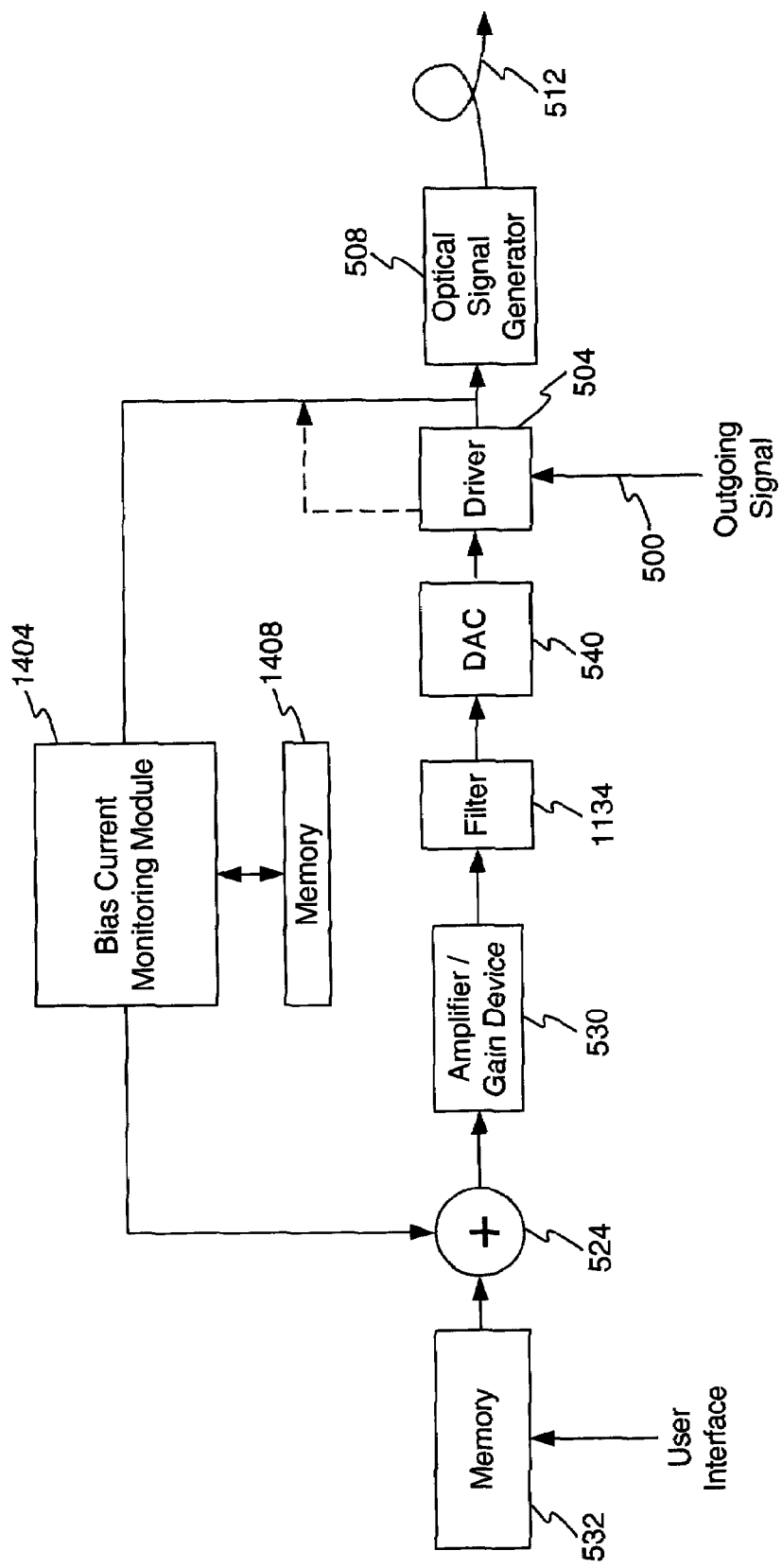
FIG. 14 illustrates a block diagram of an example embodiment of an optic signal modulation control system with a bias current feedback loop.

FIG. 14 illustrates a block diagram of an optic signal power control system utilizing bias current monitoring. This is but one possible example embodiment and, as such, it is contemplated that one of ordinary skill in the art may determine other embodiments or configuration that also monitor bias current, yet do not depart from the claims that follow. In general, any method of monitoring bias current may be utilized and the step or a system for detecting a current is generally understood, such as, through the use of peak detectors, comparators, A/D converters, trans-impedance amplifiers, current mirrors, as well as state machines used to control some or all of the aforementioned. As a result, the particular current detection system is not described in detail and the claims that follow are not limited to one particular type of current monitor.

In this embodiment, a bias current monitoring module 1404 connects to either the driver 504, one or more of the driver outputs as shown, or both. Via these connections, the bias current monitoring module 1404 receives the bias current value. Upon receipt of the bias current value, the bias current monitoring module 1404 is configured to process the bias current value to thereby generate a correction value, which may be output to the junction 524.

In one embodiment, the bias current monitoring module 1404 connects to a memory module 1408 or may communicate with memory 532. Either of the memories, or another memory, not shown, may store one or more threshold values to which the bias current value is compared. Based on this comparison, the correction value may be generated and provided to the junction 524. The comparison may occur using one or more comparators, control logics, or any HW/SW control module, and may occur in the analog or digital domain, any of which may be located in the module 1404. The difference between a threshold or optimum bias current value, that is stored in memory, and the actual bias current value may comprise the correction or compensation value, or may be used to retrieve a desired correction or compensation value that is stored in memory.

In one embodiment, the bias current monitoring module 1404 comprises processing capability configured to execute one or more equations. The equations may comprise any type equation selected to calculate a correction or compensation value based on the detected bias current value. In one embodiment, the equation comprises a polynomial configured compensate for optic signal power change and/or slope efficiency variations based on the detected bias current value.

While various embodiments of the invention have been described, it will be apparent to those of ordinary skill in the art that many more embodiments and implementations are possible that are within the scope of this invention. In addition the various components may be combined or enabled alone, or in any combination.

What is claimed is:

1. A closed loop optic signal control system comprising:
a memory configured to store one or more target values;
a driver configured to process an outgoing signal based on the one or more target values and one or more feedback values, wherein the target values represent driver control values;
an optic signal generator configured to generate an optic signal representative of the outgoing signal based on the one or more target values, the one or more feedback values, or both; and
a detector configured to monitor one or more aspects of the optic signal and generate one or more feedback signals, wherein the one or more feedback signals are configured to supplement or replace the one or more target values to thereby maintain the one or more aspects of the optic signal at a specified level.

2. The system of claim 1, further comprising one or more junctions configured to combine the one or more feedback signals with the one or more target values to create one or more driver control values to control the driver.

3. The system of claim 1, further comprising one or more analog to digital converters and one or more digital to analog converters configured to process one or more of the one or more target signals and one or more feedback signals.

4. The system of claim 1, further comprising one or more integrators configured to provide second order control, wherein one or more target values and one or more feedback signals are combined as inputs to the one or more integrators, and where the one or more integrator outputs provide one or more driver control values.

5. The system of claim 1, wherein the one or more target values, the one or more feedback signals, or both are configured to control one or more of the following parameters: driver bias current, driver modulation current, and/or directly and/or indirectly optic signal extinction ratio, and optic signal power.

6. An open loop optic signal control system comprising:
a memory configured to store one or more target values in a digital format, wherein the target values control the extinction ratio of the optic signal and/or the power of the optic signal;

a digital to analog converter configured to convert the one or more target values to an analog format;

a driver configured to process an outgoing signal based on the one or more target values, wherein the target values represent driver control values that control the extinction ratio of the optic signal and/or the optical output power; and an optical signal generator configured to generate an optic signal representative of the outgoing signal based on the one or more target values.

7. The system of claim 6, wherein the one or more target values are generated during a calibration process.

8. The system of claim 6, wherein the memory is accessible to thereby allow for changes to the one or more target values.

9. The system of claim 6, further comprising a HW/SW control module configured to select from two or more target values to utilize as the target value that controls the extinction ratio and/or optical output power.

10. The system of claim 6, wherein the one or more target values are configured to control one or more of the following parameters: driver bias current, and driver modulation current, and/or directly and/or indirectly optic signal extinction ratio, and optic signal power.

11. The system of claim 6, wherein the optical signal generator comprises a laser.

12. A transceiver configured to control and maintain one or more aspects of a transmitted optic signal comprising:

an optical receiver comprising an optical detector and one or more amplifiers configured to convert an optical signal into an amplified electrical received signal;

an optic transmitter comprising:

an optic signal generator configured to convert an electrical signal to an optical signal, wherein one or more parameters of the optical signal are determined by one or more control values;

a driver configured to provide one or more drive signals to the optic signal generator, the one or more drive signals based on one or more control values;

a memory configured to store one or more control values, wherein the control values are selected to control the power level of the optic singal; and a closed loop feedback system configured to monitor one or more aspects of the optic signal and generate one or more feedback signals that may modify the one or more control values or one or more drive signals.

13. The system of claim 12, wherein the one or more parameters of the optical signal comprise at least power level and optic signal extinction ratio.

14. The system of claim 12, wherein the optical signal generator is a generator selected from the group of generators consisting of a laser, photodiode, and electronic light emitting device.

15. The system of claim 12, further comprising a closed loop feedback system configured to monitor one or more aspects of the optic signal and generate one or more feedback signals that may modify the one or more control values.

16. The system of claim 12, further comprising a switch configured to selectively output for use the one or more control values stored in memory or the one or more control values stored in memory modified by the one or more feedback signals.

17. The system of claim 12, further comprising a memory interface configured to write one or more different control values to the memory.

18. A method for controlling one or more aspects of an optic signal comprising:

monitoring the optic signal;

detecting one or more aspects of the optic signal;

generating one or more feedback signals comprising an electrical signal representing the one or more aspects of the optic signal;

comparing the one or more feedback signals to one or more target values to generate one or more error signals;

generating one or more control signals based on the one or more error signals;

providing the one or more control signals to an optic signal driver to control the one or more aspects of the optic signal.

19. The method of claim 18, wherein generating one or more control signals comprises increasing or decreasing at least one of the target values.

20. The method of claim 18, wherein the one or more aspects of the optical signal comprise at least an optic signal extinction ratio.

21. The method of claim 18, wherein the detecting is performed by an optical detector.

22. The method of claim 18, wherein the one or more target values are in a digital format and the one or more control values are in an analog format and the method further comprises converting the one or more feedback signals to a digital format and converting the one or more control signals from a digital format to an analog format.

* * * * *